(12) United States Patent
Kim et al.

(10) Patent No.: US 12,326,658 B2
(45) Date of Patent: Jun. 10, 2025

(54) PELLICLE FOR EXTREME ULTRAVIOLET LITHOGRAPHY CONTAINING MOLYBDENUM CARBIDE

(71) Applicant: KOREA ELECTRONICS TECHNOLOGY INSTITUTE, Seongnam-si (KR)

(72) Inventors: Hyeong Keun Kim, Yongin-si (KR); Seul Gi Kim, Yongin-si (KR); Hyun Mi Kim, Seoul (KR); Jin Woo Cho, Seoul (KR); Yong Kyung Kim, Gwangju-si (KR)

(73) Assignee: KOREA ELECTRONICS TECHNOLOGY INSTITUTE, Seongnam-si (KR)

( * ) Notice: Subject to any disclaimer, the term of this patent is extended or adjusted under 35 U.S.C. 154(b) by 638 days.

(21) Appl. No.: 17/698,427

(22) Filed: Mar. 18, 2022

(65) Prior Publication Data

US 2022/0326603 A1  Oct. 13, 2022

(30) Foreign Application Priority Data

Apr. 9, 2021  (KR) ........................ 10-2021-0046187

(51) Int. Cl.
*G03F 1/62* (2012.01)
(52) U.S. Cl.
CPC ..................... *G03F 1/62* (2013.01)
(58) Field of Classification Search
CPC ..................... G03F 1/62; G03F 1/64
USPC .......................................................... 430/5
See application file for complete search history.

(56) References Cited

U.S. PATENT DOCUMENTS

| | | | | |
|---|---|---|---|---|
| 10,228,615 | B2 * | 3/2019 | Nikipelov | G03F 1/38 |
| 10,698,312 | B2 * | 6/2020 | Van Zwol | G03F 7/70575 |
| 2019/0056654 | A1 | 2/2019 | Péter et al. | |
| 2019/0129299 | A1 | 5/2019 | Nasalevich et al. | |
| 2020/0073230 | A1 | 3/2020 | Lin | |
| 2020/0406244 | A1 | 12/2020 | Kurganova et al. | |

FOREIGN PATENT DOCUMENTS

| | | |
|---|---|---|
| DE | 102017202861 A1 | 4/2017 |
| KR | 10-2018-0135490 A | 12/2018 |
| KR | 10-2020-0130289 A1 | 11/2020 |
| KR | 10-2020-0141913 A1 | 12/2020 |
| TW | 201725178 A | 7/2017 |
| TW | 201807507 A | 3/2018 |
| TW | 201945076 A | 12/2019 |
| TW | 202006460 A | 2/2020 |
| WO | WO 2019-170356 A1 | 12/2019 |
| WO | 2020/008976 A1 | 1/2020 |

OTHER PUBLICATIONS

Office Action of Corresponding TW patent application No. 111,111,949 (issued on Nov. 15, 2022).
Office Action dated Apr. 25, 2023 in Japanese Application No. 2022-064475.
Office Action dated Oct. 18, 2023 in Korean Application No. 10-2021-0046187.
Extended European Search Report of corresponding European patent application No. 22162246.7 (Issued on Sep. 14, 2022).

* cited by examiner

*Primary Examiner* — Christopher G Young
(74) *Attorney, Agent, or Firm* — Knobbes, Martens, Olson & Bear, LLP

(57) ABSTRACT

A pellicle for extreme ultraviolet lithography containing molybdenum carbide is disclosed. The pellicle includes a substrate having an opening formed in a central portion, and a pellicle layer formed on the substrate to cover the opening and including a molybdenum carbide containing layer that contains molybdenum carbide expressed as $MoC_{1-x}$ ($0<x<1$). The pellicle layer includes a core layer formed on the substrate to cover the opening, and the core layer may be the molybdenum carbide containing layer.

17 Claims, 31 Drawing Sheets

PELLICLE FOR EXTREME ULTRAVIOLET LITHOGRAPHY CONTAINING MOLYBDENUM CARBIDE

TECHNICAL FIELD

The present disclosure relates to a semiconductor lithography technology. More particularly, the present disclosure relates to a pellicle for extreme ultraviolet lithography containing molybdenum carbide and installed in a mask used in a lithography process using extreme ultraviolet rays.

BACKGROUND

As the semiconductor industry continues to develop and the degree of semiconductor integration is dramatically improved, electronic devices are becoming smaller and lighter. In order to further improve the degree of semiconductor integration, the advancement of lithography technology is required.

Currently, technology is developing toward realizing a fine pattern of a semiconductor by reducing the wavelength of light. Extreme ultraviolet (EUV) lithography technology, recently developed as a next-generation technology, can realize a fine pattern through a single resist process.

An extreme ultraviolet lithography apparatus used in a semiconductor process includes a light source power, a resist, a pellicle, and a mask. The pellicle is installed on the mask to prevent contaminants generated during the lithography process from adhering to the mask, and is selectively used depending on the lithography machine.

In the extreme ultraviolet lithography process, there was an expectation that the pellicle would not be needed because a clean system was built. However, it has been known that during an actual operation after the construction of the lithography apparatus, contamination of the mask is caused by foreign substances generated from an internal driving unit of the apparatus, particles of tin generated in the oscillation of the light source, and extreme ultraviolet photoresist.

Therefore, in the extreme ultraviolet lithography process, the pellicle is recognized as an essential component so as to prevent contamination of the mask. When the pellicle is used, defects smaller than 10,000 nm in size are negligible.

The pellicle for extreme ultraviolet lithography is required to have a size of 110 mm×144 mm to cover the mask, and an extreme ultraviolet transmittance of 90% or more is required in order to minimize deterioration of productivity due to loss of a light source. In addition, mechanical stability that the pellicle is not damaged by physical movement up to 20 G inside the extreme ultraviolet lithography apparatus, and thermal stability that the pellicle can withstand a thermal load of 250 W or more based on a 5 nm node are required. Also, chemical durability that the pellicle does not react to hydrogen radicals generated in an extreme ultraviolet environment is required.

Currently, pellicle development companies are developing transmissive materials based on polycrystalline silicon (p-Si) or SiN. However, such materials do not satisfy a transmittance of 90% or more, which is the most important condition of a pellicle for extreme ultraviolet lithography. Also, such materials have weaknesses in thermal stability, mechanical stability, and chemical durability in an extreme ultraviolet lithography environment, so that process development research is being conducted to supplement their properties. For example, materials such as Mo, Ru, and Zr have been selected and studied as materials for solving the problems of SiN-based materials, but it is difficult to manufacture a thin film and maintain its shape.

Recently, a pellicle having an extreme ultraviolet transmittance of 90% or more and thermal, chemical, and mechanical stability in an extreme ultraviolet output environment of 350 W or more, exceeding an irradiation intensity of 250 W level, is required.

SUMMARY

The present disclosure provides a pellicle for extreme ultraviolet lithography containing molybdenum carbide having an extreme ultraviolet transmittance of 90% or more in an extreme ultraviolet output environment of 350 W or more.

In addition, the present disclosure provides a pellicle for extreme ultraviolet lithography containing molybdenum carbide having thermal stability, mechanical stability and chemical durability while having a high extreme ultraviolet transmittance of 90% or more.

According to embodiments of the present disclosure, a pellicle for extreme ultraviolet lithography may include a substrate having an opening formed in a central portion, and a pellicle layer formed on the substrate to cover the opening and including a molybdenum carbide containing layer that contains molybdenum carbide expressed as $MoC_{1-x}$ (0<x<1). The pellicle layer may include a core layer formed on the substrate to cover the opening, and the core layer may be the molybdenum carbide containing layer.

In the pellicle, the molybdenum carbide containing layer may contain crystalline or amorphous molybdenum carbide in a form of a mixture or, in part, grains.

In the pellicle, the molybdenum carbide containing layer may contain $Mo_2C$.

In the pellicle, the pellicle layer may further include a capping layer formed on the core layer.

In the pellicle, a material of the capping layer may include at least one of nitride, oxide, boride, carbide, and silicide.

In the pellicle, the capping layer may contain molybdenum carbide.

The pellicle may further include a support layer interposed between the substrate and the pellicle layer, formed on the substrate to cover the opening, and formed of a material including at least one of $SiN_x$, $SiO_2$, SiC, and $Mo_2C$.

In the pellicle, the pellicle layer may further include a capping layer formed on the core layer, and a buffer layer formed at least one of between the substrate and the core layer and between the core layer and the capping layer.

In the pellicle, at least one of the capping layer and the buffer layer may contain molybdenum carbide.

In the pellicle, when the buffer layer contains molybdenum carbide, a material of the capping layer may include at least one of nitride, oxide, boride, carbide, and silicide.

In the pellicle, when the capping layer contains molybdenum carbide, a material of the buffer layer may include at least one of B, C, Zr, $B_4C$, BN, $SiN_x$ (x≥1), $MoSi_2$, RuC, $NbC_x$ (0<x≤1), $YC_x$ (0.5≤x≤2), $ZrSi_x$ (x≤2), $ZrC_x$ (0.3≤x≤1), $ZrB_x$ (2≤x≤16), $ZrB_xSi_y$ (x≥2, y≥2), $ZrC_xB_y$ (0.8≤x≤1.2, y≥2), and $ZrC_xSi$ (0.8≤x≤1.2, y≤2).

According to embodiments of the present disclosure, a pellicle for extreme ultraviolet lithography may include a pellicle layer including a molybdenum carbide containing layer that contains molybdenum carbide expressed as $MoC_{1-x}$ (0<x<1), the pellicle layer including a core layer formed on a substrate to cover an opening of the substrate, wherein the core layer is the molybdenum carbide containing layer.

In the pellicle, the molybdenum carbide containing layer may contain crystalline or amorphous molybdenum carbide in a form of a mixture or, in part, grains.

In the pellicle, the molybdenum carbide containing layer may contain $Mo_2C$.

In the pellicle, the pellicle layer may further include a capping layer formed on one surface or both surfaces of the core layer.

In the pellicle, the capping layer may contain molybdenum carbide.

In the pellicle, the pellicle layer may further include a buffer layer formed on one surface or both surfaces of the core layer, and a capping layer formed on the buffer layer, wherein at least one of the buffer layer and the capping layer contains molybdenum carbide.

According to the present disclosure, by applying molybdenum carbide to the pellicle layer, it is possible to provide the pellicle for extreme ultraviolet lithography having an extreme ultraviolet transmittance of 90% or more and a reflectance of 0.04% or less in an extreme ultraviolet output environment of 350 W or more. That is, by forming at least one of the core layer, the buffer layer, and the capping layer in the pellicle layer as the molybdenum carbide containing layer, the pellicle for extreme ultraviolet lithography can be provided to have an extreme ultraviolet transmittance of 90% or more and a reflectance of 0.04% or less in an extreme ultraviolet output environment of 350 W or more.

The molybdenum carbide containing layer is a binary material of molybdenum (Mo) and carbon (C) expressed as $MoC_{1-x}$ ($0 \leq x \leq 1$) and can be easily manufactured using a deposition method. In addition, the molybdenum carbide containing layer can be prepared as a carbide at a lower temperature, for example, 700° C., than other carbides.

In a process of forming the molybdenum carbide containing layer, $Mo_2C$ may be easily formed in a thin film through sputtering of Mo and then heat treatment in a hydrocarbon atmosphere or through sputtering of $Mo_2C$ target and then heat treatment in an inert gas atmosphere. When the molybdenum carbide containing layer is formed through sputtering, it is also advantageous to control the thickness uniformity.

The molybdenum carbide containing layer contains crystalline or amorphous $Mo_2C$ in the form of a mixture or, in part, grains, and, as a carbide, is capable of providing the pellicle with high erosion and wear resistance, resistance to hydrogen radicals, and chemical stability at high temperatures.

In addition, the molybdenum carbide containing layer can be used as an etch stopper in dry etching and wet etching environments for the production of a freestanding membrane because of the erosion resistance and chemical resistance of $Mo_2C$.

DETAILED DESCRIPTION

Hereinafter, an embodiment of the present disclosure will be described in detail with reference to the accompanying drawings. The present disclosure may, however, be embodied in many different forms and should not be construed as being limited to the embodiment set forth herein. Rather, this embodiment is provided so that the disclosure will be thorough and complete and will fully convey the scope of the disclosure to those skilled in the art. Accordingly, an embodiment described herein should be understood to include various modifications, equivalents, and/or alternatives.

In addition, techniques that are well known in the art and not directly related to the present disclosure are not described herein. This is to clearly convey the subject matter of the present disclosure by omitting an unnecessary explanation. Also, the terms are merely used for describing a particular embodiment but do not limit the embodiment. Singular forms are intended to include plural forms unless the context clearly indicates otherwise.

First Embodiment

Figure 1:
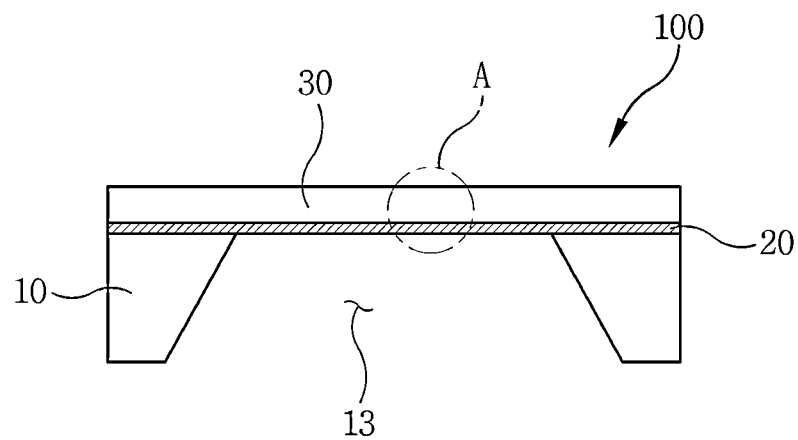
FIG. 1 is a cross-sectional view showing a pellicle for extreme ultraviolet lithography containing molybdenum carbide according to a first embodiment of the present disclosure.
Figure 2:
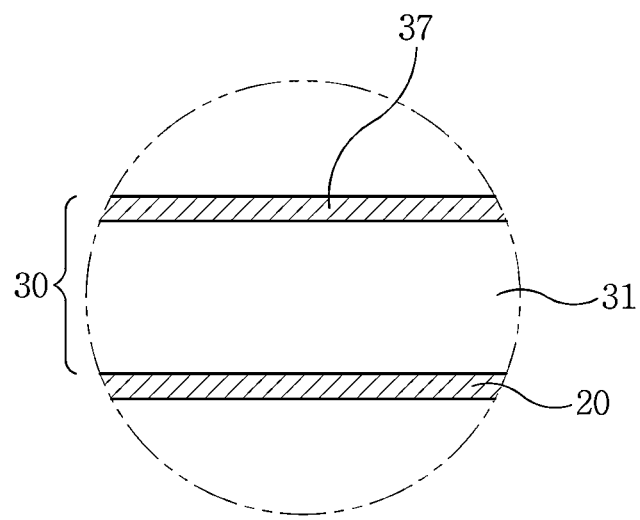
FIG. 2 is an enlarged view of part A of FIG. 1.

FIG. 1 is a cross-sectional view showing a pellicle for extreme ultraviolet lithography containing molybdenum carbide according to a first embodiment of the present disclosure. FIG. 2 is an enlarged view of part A of FIG. 1.

Referring to FIGS. 1 and 2, a pellicle 100 for extreme ultraviolet lithography according to the first embodiment (hereinafter referred to as 'pellicle') includes a substrate 10 having an opening 13 formed in its central portion, and a pellicle layer 30 formed on the substrate 10 so as to cover the opening 13 and including a molybdenum carbide containing layer that contains molybdenum carbide expressed as $MoC_{1-x}$ (0<x<1). The pellicle layer 30 may include a core layer 31 and a capping layer 37 that are sequentially stacked on the substrate 10.

The pellicle 100 according to the first embodiment may further include a support layer 20. The support layer 20 is interposed between the substrate 10 and the pellicle layer 30, and is formed on the substrate 10 to cover the opening 13.

The pellicle 100 is a consumable component that protects a mask from contaminants in a lithography process for semiconductor or display manufacturing. That is, the pellicle 100 is a thin film overlying the mask and serves as a cover. Because the light transferred to the wafer is focused with the mask in a lithographic exposure, even if contaminants exist on the pellicle 100 that is separated by a certain distance, it is possible to minimize a problem of forming a defective pattern due to out of focus.

As such, the pellicle 100 may minimize defective patterns while protecting the mask from contaminants during the exposure process, thereby greatly increasing the yield of semiconductor or display manufacturing. In addition, the use of the pellicle 100 can increase the lifespan of the mask.

Now, the pellicle 100 according to the present disclosure will be described in detail.

The substrate 10 supports the support layer 20 and the pellicle layer 30 and makes it easy to handle and transport the pellicle 100 during and after the process of manufacturing the pellicle 100. The substrate 10 may be formed of a material such as silicon available for an etching process. For example, the material of the substrate 10 includes, but is not limited to, silicon, silicon oxide, silicon nitride, metal oxide, metal nitride, graphite, amorphous carbon, or a laminated structure of such materials. Here, metal may be, but is not limited to, Cr, Al, Zr, Ti, Ta, Nb, Ni, or the like.

The support layer 20 serving as an etch stopper is formed on the substrate 10. The pellicle layer 30 is formed on the support layer 20.

The support layer 20 is formed of a material having resistance to KOH, and also functions to prevent the material of the pellicle layer 30 from being diffused into the substrate 10. The material of the support layer 20 may include at least one of $SiN_x$, $SiO_2$, SiC, and $Mo_2C$. Here, $SiN_x$ may include $Si_3N_4$. The support layer 20 may be formed by a chemical vapor deposition (CVD) process, but it is formed by an atomic layer deposition (ALD), e-beam evaporation, or sputtering process so as to have the best transmittance and minimize defects through free control of thickness, physical properties, and chemical composition. The support layer 20 may be formed on the substrate 10 to have a thickness of 1 nm to 10 nm. The support layer 20 may be formed to have a thickness corresponding to the capping layer 37.

The opening 13 in the central portion of the substrate 10 may be formed using a micro-machining technique such as micro-electro mechanical systems (MEMS). That is, the opening 13 is formed by removing the central portion of the substrate 10 under the support layer 20 by means of the micro-machining technique. The opening 13 partially exposes the etch stopper 20 under the pellicle layer 30.

The pellicle layer 30 includes the core layer 31 and the capping layer 37. At least one of the core layer 31 and the capping layer 37 is a molybdenum carbide containing layer.

The core layer 31 is a layer that determines the transmittance of extreme ultraviolet rays. The core layer 31 has a transmittance of 90% or more for extreme ultraviolet rays, and effectively dissipates heat to prevent overheating of the pellicle layer 30.

The capping layer 37 provides thermal stability, mechanical stability, and chemical durability to the pellicle layer 30 while minimizing a decrease in the transmittance of the core layer 31 for extreme ultraviolet rays. Specifically, the capping layer 37 is a protective layer for the core layer 31 and provides thermal stability by effectively dissipating heat generated in the core layer 31 to the outside. In addition, the capping layer 37 provides mechanical stability by supplementing the mechanical strength of the core layer 31. In addition, the capping layer 37 provides chemical durability by protecting the core layer 31 from hydrogen radicals and oxidation.

The molybdenum carbide containing layer is a binary material of molybdenum (Mo) and carbon (C) expressed as $MoC_{1-x}$ (0<x<1) and can be easily manufactured using a deposition method. The molybdenum carbide containing layer may contain $MoC_{1-x}$ (0.5≤x<1) in which carbon and molybdenum having a valence of divalent or higher are combined. The molybdenum carbide containing layer may contain crystalline or amorphous $Mo_2C$ in the form of a mixture or, in part, grains. The molybdenum carbide containing layer may be a $Mo_2C$ layer composed of $Mo_2C$.

The molybdenum carbide containing layer can be prepared as a carbide at a lower temperature, for example, 700° C., than other carbides. That is, the temperature at which crystallization starts is 900° C. for silicon carbide and 1000° C. or more for zirconium carbide and boron carbide. However, because molybdenum carbide has a high bonding strength between molybdenum and carbon, carbide preparation begins at 700° C.

In a process of forming the molybdenum carbide containing layer, $Mo_2C$ may be easily formed in a thin film through sputtering of Mo and then heat treatment in a hydrocarbon atmosphere or through sputtering of $Mo_2C$ target and then heat treatment in an inert gas atmosphere. When the molybdenum carbide containing layer is formed through sputtering, it is also advantageous to control the thickness uniformity.

The molybdenum carbide containing layer, as a carbide, is capable of providing the pellicle 100 with high erosion and wear resistance, resistance to hydrogen radicals, and chemical stability at high temperatures.

In addition, the molybdenum carbide containing layer can be used as an etch stopper in dry etching and wet etching environments for the production of a freestanding membrane because of the erosion resistance and chemical resistance of $Mo_2C$.

First, the core layer 31 may be the molybdenum carbide containing layer. By forming the core layer 31 containing molybdenum carbide to a thickness of 18 nm or less, it is possible to provide a pellicle for extreme ultraviolet lithography having an extreme ultraviolet transmittance of 90% or more and a reflectance of 0.04% or less in an extreme ultraviolet output environment of 350 W or more.

With respect to the core layer 31 containing molybdenum carbide, the material of the capping layer 37 may include at least one of nitride, oxide, boride, carbide, and silicide. Here, the nitride may include $SiN_x$, SiON, BN, or BCN. The oxide may include $SiO_2$. The boride may include $ZrB_x$ ($2 \leq x < 16$), $ZrB_xSi_y$ ($x \geq 2$, $y \geq 2$), $YB_x$ ($x \geq 2$), or $SiB_6$. The carbide may include SiC, $Mo_2C$, or $B_4C$. The silicide may include $ZrSi_x$ ($x \geq 2$).

As such, by forming the core layer 31 as the molybdenum carbide containing layer, it is possible to provide a pellicle for extreme ultraviolet lithography having an extreme ultraviolet transmittance of 90% or more and a reflectance of 0.04% or less in an extreme ultraviolet output environment of 350 W or more.

In addition, because molybdenum carbide can be easily formed through a typical deposition process, using molybdenum carbide as the material of the core layer 31 can simplify the manufacturing process of the core layer 31 than using graphene or a multi-component material.

Next, the capping layer 37 may be the molybdenum carbide containing layer. The capping layer 37 formed with the molybdenum carbide containing layer may have a thickness of 10 nm or less.

With respect to the capping layer 37 formed with the molybdenum carbide containing layer, the material of the core layer 31 may include at least one of graphene, Me-α (Me is at least one of Zr and Mo, and α is at least one of nitride, boride, carbide, and silicide), $ZrSi_2$, $ZrB_x$ ($2 \leq x < 16$), $ZrB_xSi_y$ ($x \geq 2$, $y \geq 2$), and $YB_x$ ($x \geq 2$).

When the core layer 31 is formed of graphene, it may be formed by a transfer method or a direct growth method.

The transfer method is a method of forming the core layer 31 by transferring graphene grown on a separate substrate onto the support layer 20 of the substrate 10.

The direct growth method is a method of directly growing graphene on the support layer 20 of the substrate 10 by using interlayer exchange between a metal catalyst layer and a source layer of an amorphous carbon material through heat treatment. Of course, the metal catalyst layer is removed after the graphene is directly grown. A seed layer may be formed on the support layer 20 so that graphene, which is directly grown through interlayer exchange, can be stably bonded on the support layer 20. As the seed layer, at least one of an amorphous carbon layer formed to a thickness of 5 nm or less, few-layer graphene, amorphous boron, BN, BCN, $B_4C$, and Me-X (Me is at least one of Si, Ti, Mo, and Zr, and X is at least one of B, C, and N) may be used.

The above-described pellicle 100 according to the first embodiment may be manufactured by the following manufacturing process. First, the support layer 20, the core layer 31, and the capping layer 37 are sequentially stacked on the substrate 10 in which the opening 13 is not formed.

At this time, the support layer 20 may be formed by a CVD, ALD, e-beam deposition, or sputtering process.

The core layer 31 and the capping layer 37 may be formed using various deposition methods such as sputtering, CVD, and ALD.

The molybdenum carbide containing layer included in the pellicle layer 30 may be formed by sputtering. For example, in case that a $Mo_2C$ layer is formed as the molybdenum carbide containing layer, a Mo thin film is deposited on the support layer 20 by sputtering. Then, by heat-treating the Mo thin film in an atmosphere containing hydrocarbon gas and hydrogen at a temperature of 700° C. or higher, it is possible to form the $Mo_2C$ layer on the support layer.

Thereafter, by removing the central portion of the substrate 10 under the core layer 31 to form the opening 13 through which the core layer 31 is partially exposed, the pellicle 100 according to the first embodiment can be obtained. That is, the opening 13 is formed by removing the central portion of the substrate 10 under the support layer 20 through wet etching. The opening 13 partially exposes the support layer 20 under the core layer 31.

Second Embodiment

Figure 3:
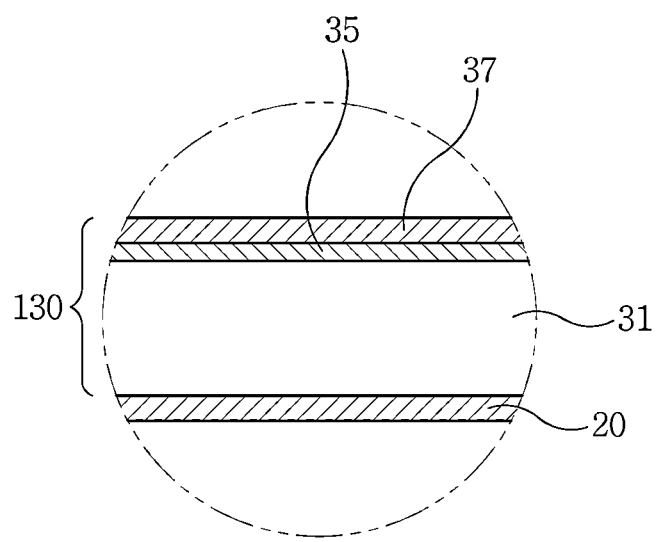
FIG. 3 is an enlarged view showing a pellicle for extreme ultraviolet lithography containing molybdenum carbide according to a second embodiment of the present disclosure.

FIG. 3 is an enlarged view showing a pellicle for extreme ultraviolet lithography containing molybdenum carbide according to a second embodiment of the present disclosure.

Referring to FIG. 3, the pellicle according to the second embodiment includes the substrate having the opening formed in the central portion, the support layer 20 formed on the substrate to cover the opening, and a pellicle layer 130 including a molybdenum carbide containing layer formed on the support layer 20. The pellicle layer 130 includes the core layer 31, a buffer layer 35, and the capping layer 37 that are sequentially stacked on the support layer 20.

In the pellicle layer 130 according to the second embodiment, the buffer layer 35 may be formed with the molybdenum carbide containing layer that contains molybdenum carbide.

Using the molybdenum carbide as the material of the buffer layer 35 can provide the pellicle according to the second embodiment having a stacked structure of the core layer 31 and the capping layer 37 of various materials.

With respect to the buffer layer 35 formed with the molybdenum carbide containing layer, the material of the capping layer 37 may include at least one of nitride, oxide, boride, carbide, and silicide. The material of the core layer 31 may include at least one of graphene, Me-α (Me is at least one of Zr and Mo, and α is at least one of nitride, boride, carbide, and silicide), $ZrSi_2$, $ZrB_x$ ($2 \leq x < 16$), $ZrB_xSi_y$ ($x \geq 2$, $y \geq 2$), and $YB_x$ ($x \geq 2$).

Meanwhile, although in the pellicle layer 130 according to the second embodiment an example in which the buffer layer 35 contains molybdenum carbide is described, this is not construed as a limitation.

Alternatively or additionally, in the pellicle layer 130 according to the second embodiment, at least one of the core layer 31 and the capping layer 37 may contain molybdenum carbide as in the first embodiment. When the core layer 31 or the capping layer 37 is formed with the molybdenum carbide containing layer, the material of the buffer layer 35 may include at least one of B, C, Zr, $B_4C$, BN, $SiN_x$ ($x \geq 1$), $MoSi_2$, RuC, $NbC_x$ ($0 \leq x \leq 1$), $YC_x$ ($0.5 \leq x \leq 2$), $ZrSi_x$ ($x \geq 2$), $ZrC_x$ ($0.3 \leq x \leq 1$), $ZrB_x$ ($2 \leq x \leq 16$), $ZrB_xSi_y$ ($x \geq 2$, $y \geq 2$), $ZrC_xB_y$ ($0.8 \leq x \leq 1.2$, $y \geq 2$), and $ZrC_xSi$ ($0.8 \leq x \leq 1.2$, $y \leq 2$). Here, C among the materials of the buffer layer 35 may include amorphous carbon, graphene, carbon nanotubes, SiC, or the like.

The above-described pellicle according to the second embodiment may be manufactured by the following manufacturing process. First, the support layer 20, the core layer 31, the buffer layer 35, and the capping layer 37 are sequentially stacked on the substrate in which the opening is not formed.

At this time, the support layer 20 may be formed by a CVD, ALD, e-beam deposition, or sputtering process.

The core layer 31, the buffer layer 35, and the capping layer 37 may be formed using various deposition methods such as sputtering, CVD, and ALD.

The molybdenum carbide containing layer included in the pellicle layer 30 may be formed by sputtering. For example, in case that a $Mo_2C$ layer is formed as the molybdenum carbide containing layer, a Mo thin film is deposited on the support layer 20 by sputtering. Then, by heat-treating the Mo thin film in an atmosphere containing hydrocarbon gas and hydrogen at a temperature of 700° C. or higher, it is possible to form the $Mo_2C$ layer on the support layer.

Thereafter, by removing the central portion of the substrate 10 under the core layer 31 to form the opening 13 through which the core layer 31 is partially exposed, the pellicle according to the second embodiment can be obtained. That is, the opening 13 is formed by removing the central portion of the substrate 10 under the support layer 20 through wet etching. The opening 13 partially exposes the support layer 20 under the core layer 31.

Third Embodiment

Figure 4:
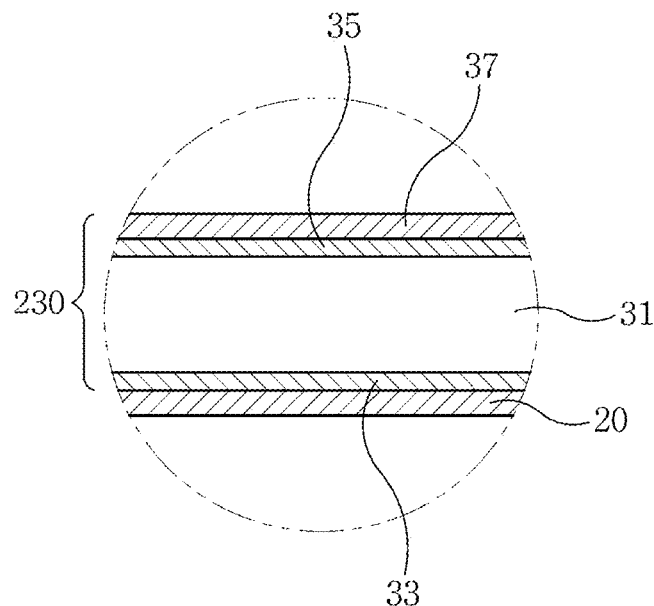
FIG. 4 is an enlarged view showing a pellicle for extreme ultraviolet lithography containing molybdenum carbide according to a third embodiment of the present disclosure.

FIG. 4 is an enlarged view showing a pellicle for extreme ultraviolet lithography containing molybdenum carbide according to a third embodiment of the present disclosure.

Referring to FIG. 4, the pellicle according to the third embodiment includes the substrate having the opening formed in the central portion, the support layer 20 formed on the substrate to cover the opening, and a pellicle layer 230 containing molybdenum carbide formed on the support layer 20. The pellicle layer 230 includes a first buffer layer 33, the core layer 31, a second buffer layer 35, and the capping layer 37 that are sequentially stacked on the support layer 20.

In the pellicle layer 230 according to the third embodiment, each of the first and second buffer layers 33 and 35 may be formed with a molybdenum carbide containing layer that contains molybdenum carbide.

Using the molybdenum carbide as the materials of the first and second buffer layers 33 and 35 can provide the pellicle according to the third embodiment having a stacked structure of the core layer 31 and the capping layer 37 of various materials.

With respect to the first and second buffer layers 33 and 35 formed with the molybdenum carbide containing layer, the material of the capping layer 37 may include at least one of nitride, oxide, boride, carbide, and silicide. The material of the core layer 31 may include at least one of graphene, Me-α (Me is at least one of Zr and Mo, and α is at least one of nitride, boride, carbide, and silicide), $ZrSi_2$, $ZrB_x$ (2≤x<16), $ZrB_xSi_y$ (x≥2, y≥2), and $YB_x$ (x≥2).

Meanwhile, although in the pellicle layer 230 according to the third embodiment an example in which the first and second buffer layers 33 and 35 contain molybdenum carbide is described, this is not construed as a limitation.

For example, the first or second buffer layer 33 or 35 may contain molybdenum carbide.

Alternatively or additionally, in the pellicle layer 230, at least one of the core layer 31 and the capping layer 37 may contain molybdenum carbide as in the first embodiment. When the core layer 31 or the capping layer 37 is formed with the molybdenum carbide containing layer, the material of the first and second buffer layers 33 and 35 may include at least one of B, C, Zr, $B_4C$, BN, $SiN_x$ (x≥1), $MoSi_2$, RuC, $NbC_x$ (0<x≤1), $YC_x$ (0.5≤x≤2), $ZrSi_x$ (x≤2), $ZrC_x$ (0.3≤x≤1), $ZrB_x$ (2<x<16), $ZrB_xSi_y$ (x≥2, y≥2), $ZrC_xB_y$ (0.8≤x≤1.2, y≥2), and $ZrC_xSi$ (0.8≤x≤1.2, y≤2). Here, C among the materials of the buffer layer 35 may include amorphous carbon, graphene, carbon nanotubes, SiC, or the like.

The above-described pellicle according to the third embodiment may be manufactured by the following manufacturing process. First, the support layer 20, the first buffer layer 33, the core layer 31, the second buffer layer 35, and the capping layer 37 are sequentially stacked on the substrate in which the opening is not formed.

At this time, the support layer 20 may be formed by a CVD, ALD, e-beam deposition, or sputtering process.

The first buffer layer 33, the core layer 31, the second buffer layer 35, and the capping layer 37 may be formed using various deposition methods such as sputtering, CVD, and ALD.

The molybdenum carbide containing layer included in the pellicle layer 30 may be formed by sputtering. For example, in case that a $Mo_2C$ layer is formed as the molybdenum carbide containing layer, a Mo thin film is deposited on the support layer 20 by sputtering. Then, by heat-treating the Mo thin film in an atmosphere containing hydrocarbon gas and hydrogen at a temperature of 700° C. or higher, it is possible to form the $Mo_2C$ layer on the support layer.

Thereafter, by removing the central portion of the substrate 10 under the core layer 31 to form the opening 13 through which the core layer 31 is partially exposed, the pellicle according to the third embodiment can be obtained. That is, the opening 13 is formed by removing the central portion of the substrate 10 under the support layer 20 through wet etching. The opening 13 partially exposes the support layer 20 under the core layer 31.

The above-described pellicle according to the present disclosure can be used in a lithography process using a light source having a wavelength of 7 nm to 13.5 nm, or 190 nm or less.

In addition, the pellicle according to the present disclosure can be free-standing by supporting the pellicle layer on a circular or rectangular frame having a diameter of 5 mm or more.

EXPERIMENTAL EXAMPLES

In order to check the transmittance and reflectance of the pellicle according to the present disclosure in an extreme ultraviolet output environment of 350 W or more, simulations were performed on the pellicles according to first to fifteenth experimental examples as shown in FIGS. 5 to 34.

First to Fifth Experimental Examples

FIGS. 5 to 14 are graphs showing transmittance and reflectance of pellicles according to first to fifth experimental examples of the present disclosure. The pellicle according to each of the first to fifth experimental examples includes the support layer, the core layer, and the capping layer. The materials of the support layer and the capping layer are $SiN_x$. The material of the core layer is $Mo_2C$.

When the thickness of the support layer is 0 nm, 3 nm, 5 nm, 7 nm, or 10 nm, the transmittance and reflectance of the pellicle according to each of the first to fifth experimental examples were simulated in an extreme ultraviolet output environment of 350 W while changing the thickness of the core layer between 0 nm and 20 nm and the thickness of the capping layer between 0 nm and 10 nm.

The pellicles according to the first to fifth experimental examples were expressed as "SiN_Mo2C_SiN(Xnm)". Here, 'SiN(Xnm)' denotes the support layer, and Xnm denotes that the thickness of the support layer is 0 nm, 3 nm, 5 nm, 7 nm, or 10 nm. Also, 'Mo$_2$C' denotes the core layer, and 'SiN' denotes the capping layer.

First Experimental Example

Figure 5:
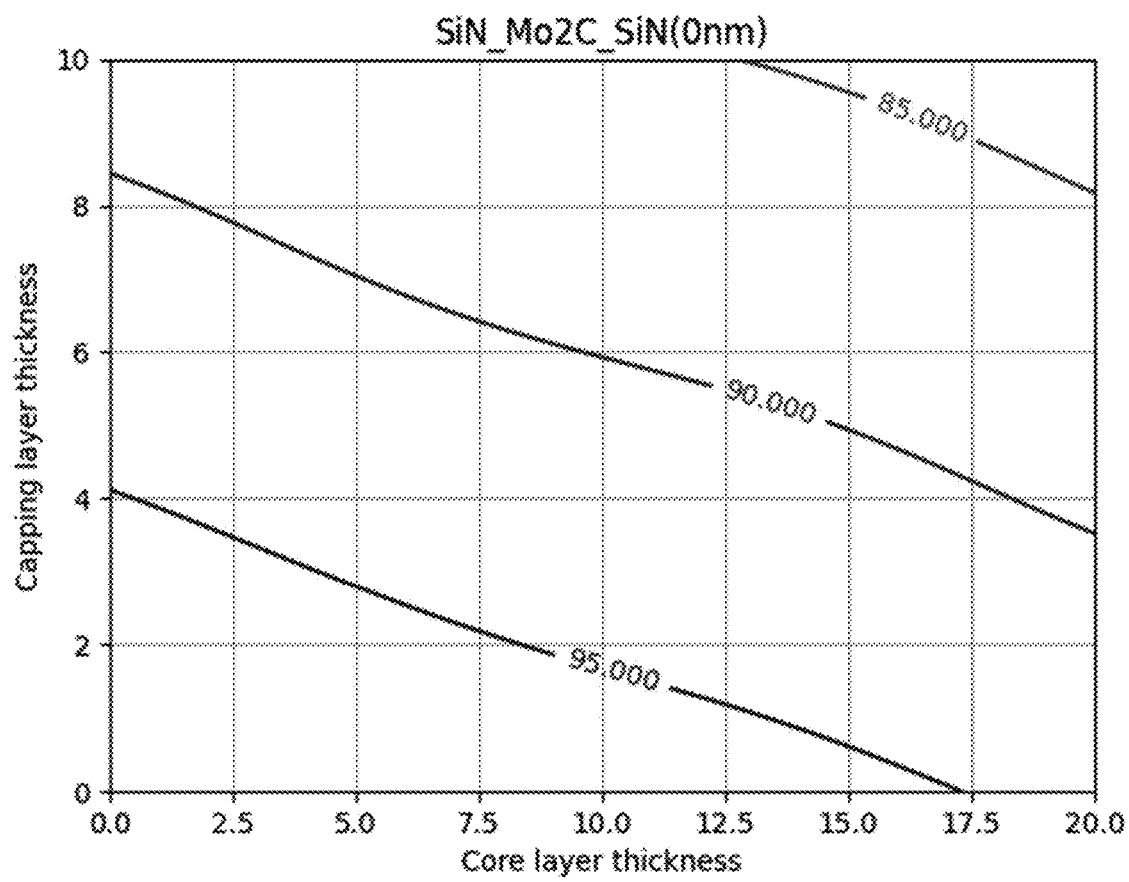
FIGS. 5 and 6 are graphs showing transmittance and reflectance of a pellicle for extreme ultraviolet lithography according to a first experimental example of the present disclosure.
Figure 6:
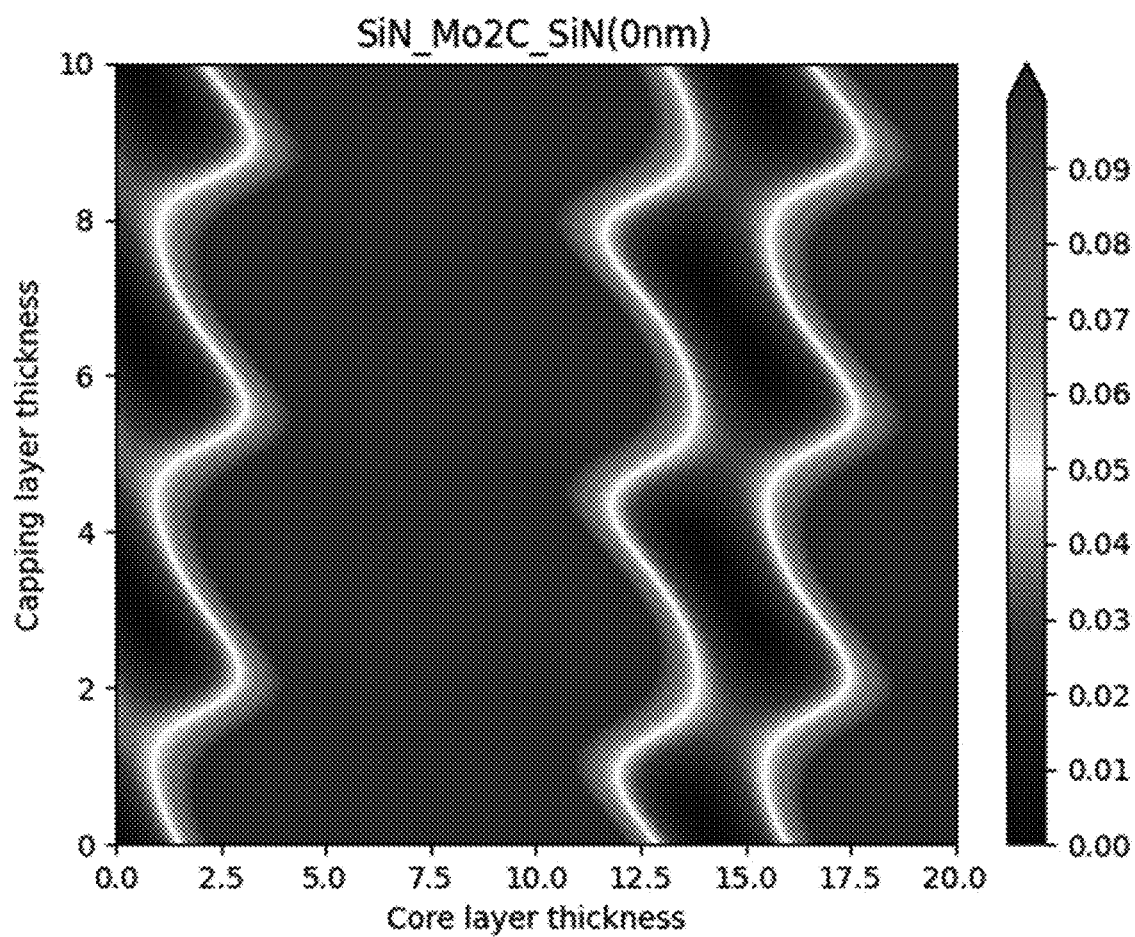

FIGS. 5 and 6 are graphs showing transmittance and reflectance of a pellicle for extreme ultraviolet lithography according to a first experimental example of the present disclosure. FIG. 5 shows the transmittance, and FIG. 6 shows the reflectance.

Referring to FIGS. 5 and 6, the pellicle according to the first experimental example was expressed as "SiN_Mo2C_SiN(0 nm)".

When the thickness of the core layer is 20 nm or less and the thickness of the capping layer is 10 nm or less, the transmittance is 85% or more. When the thickness of the core layer is 20 nm or less and the thickness of the capping layer is 9 nm or less, it can be seen that the transmittance is 90% or more.

In addition, when the thickness of the core layer is 12 to 17.5 nm and the thickness of the capping layer is 10 nm or less, it can be seen that the reflectance is 0.04% or less.

Second Experimental Example

Figure 7:
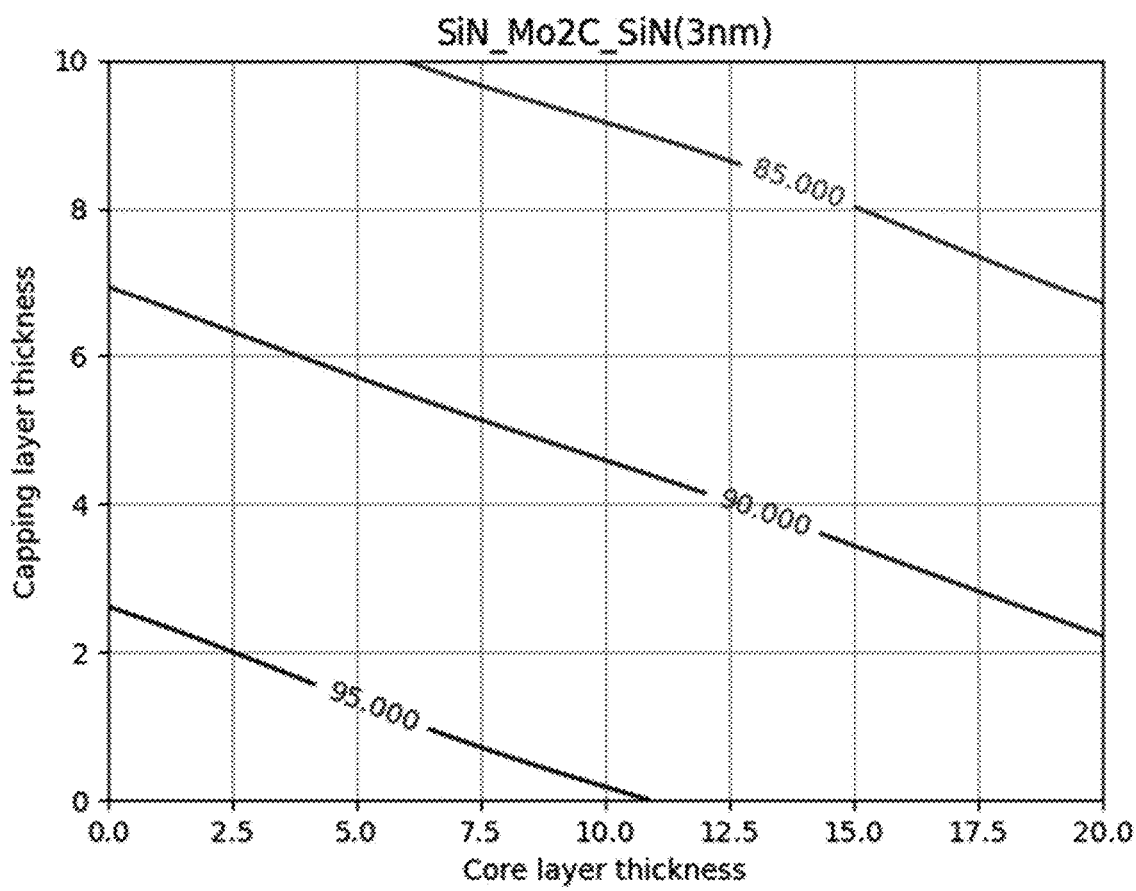
FIGS. 7 and 8 are graphs showing transmittance and reflectance of a pellicle for extreme ultraviolet lithography according to a second experimental example of the present disclosure.
Figure 8:
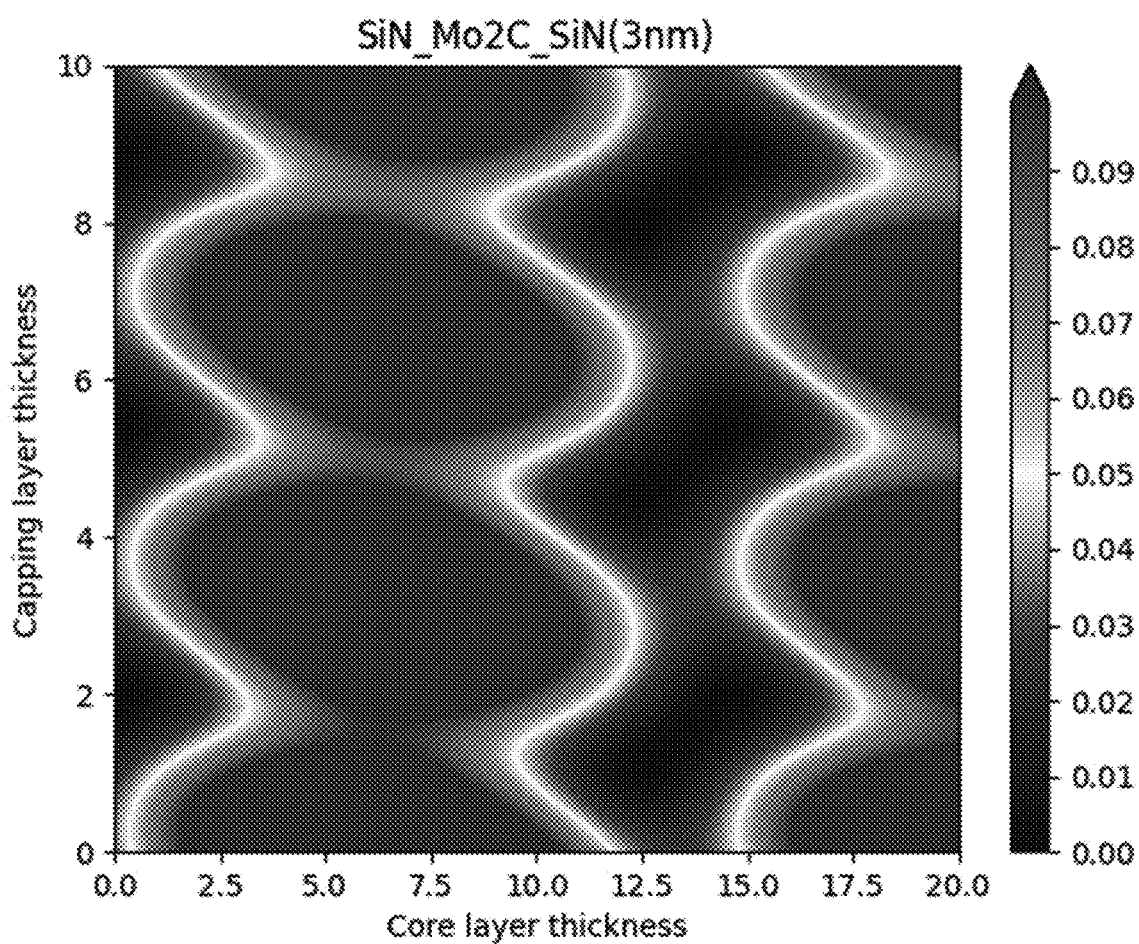

FIGS. 7 and 8 are graphs showing transmittance and reflectance of a pellicle for extreme ultraviolet lithography according to a second experimental example of the present disclosure. FIG. 7 shows the transmittance, and FIG. 8 shows the reflectance.

Referring to FIGS. 7 and 8, the pellicle according to the second experimental example was expressed as "SiN_Mo2C_SiN(3 nm)".

When the thickness of the core layer is 20 nm or less and the thickness of the capping layer is 10 nm or less, the transmittance is 85% or more. When the thickness of the core layer is 20 nm or less and the thickness of the capping layer is 7 nm or less, it can be seen that the transmittance is 90% or more.

In addition, when the thickness of the core layer is 10 to 17.5 nm and the thickness of the capping layer is 10 nm or less, it can be seen that the reflectance is 0.04% or less.

Third Experimental Example

Figure 9:
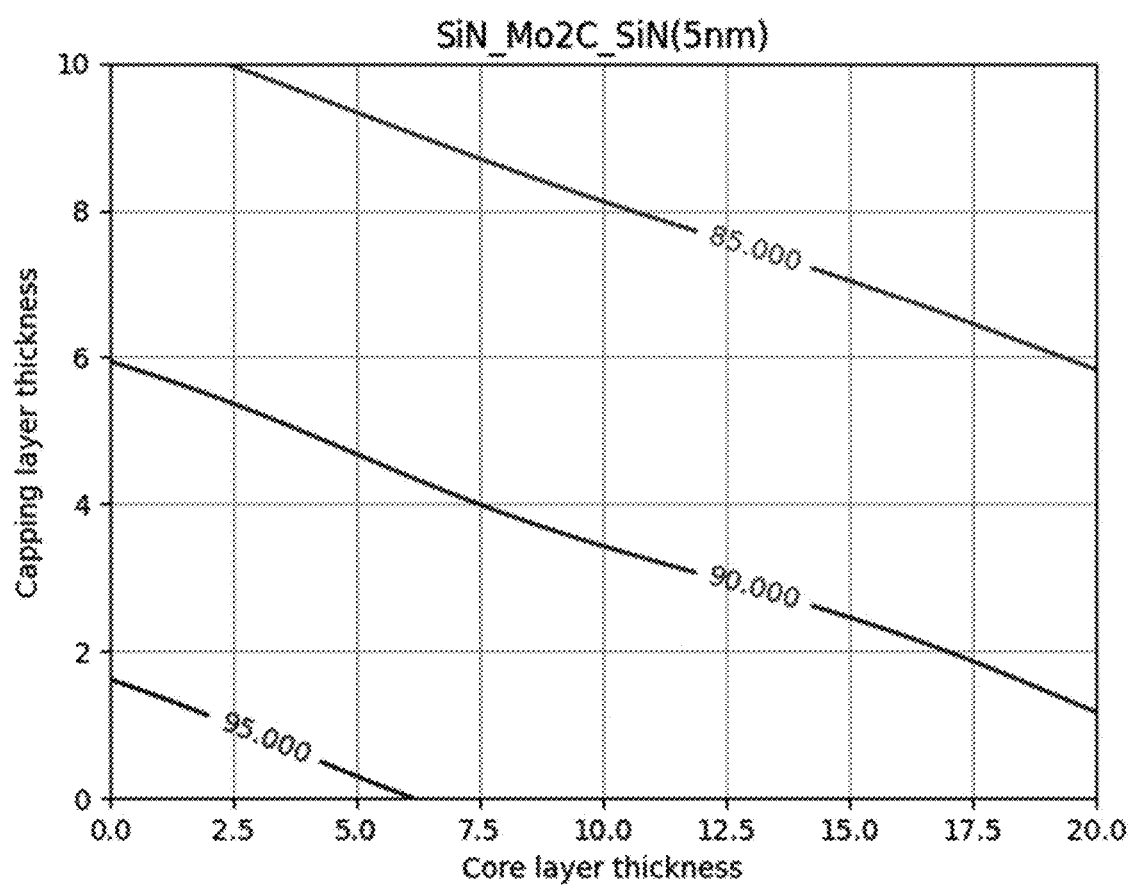
FIGS. 9 and 10 are graphs showing transmittance and reflectance of a pellicle for extreme ultraviolet lithography according to a third experimental example of the present disclosure.
Figure 10:
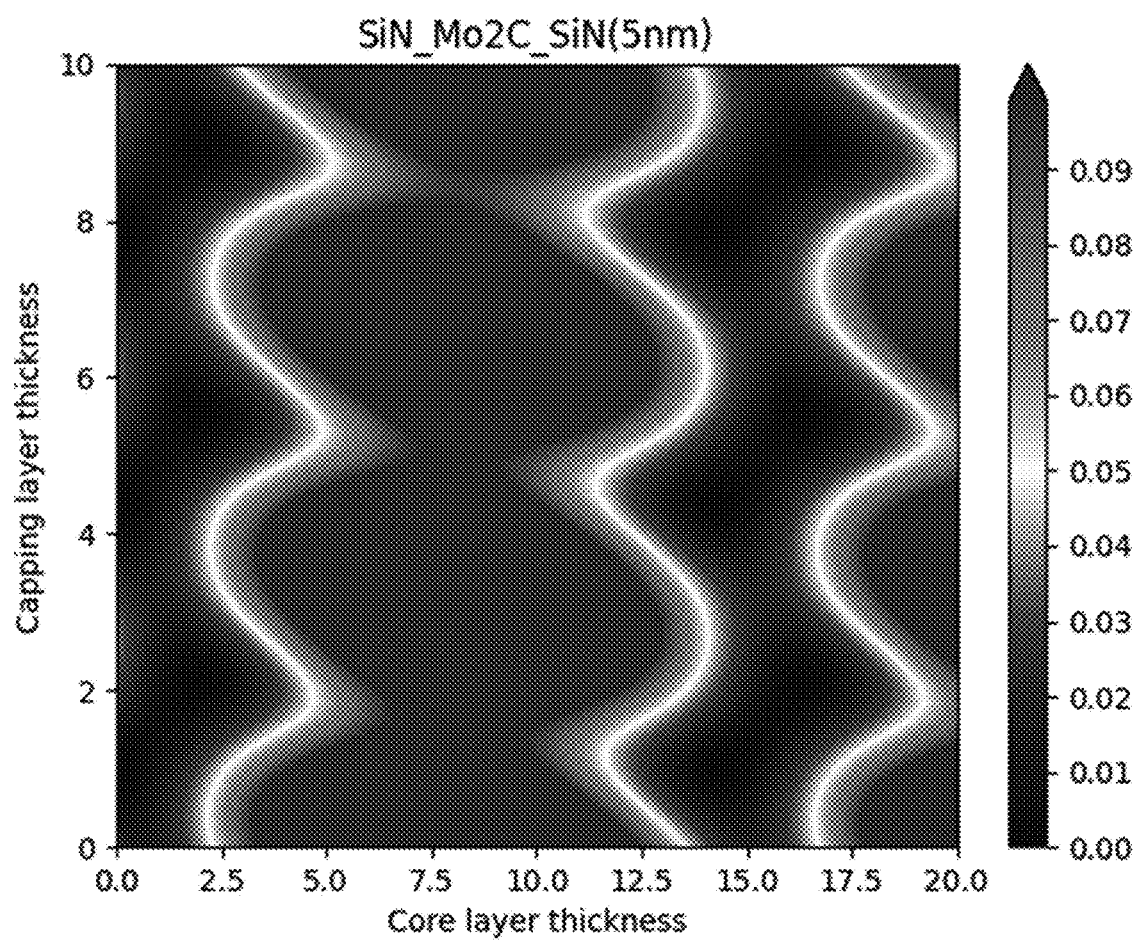

FIGS. 9 and 10 are graphs showing transmittance and reflectance of a pellicle for extreme ultraviolet lithography according to a third experimental example of the present disclosure. FIG. 9 shows the transmittance, and FIG. 10 shows the reflectance.

Referring to FIGS. 9 and 10, the pellicle according to the third experimental example was expressed as "SiN_Mo2C_SiN(5 nm)".

When the thickness of the core layer is 20 nm or less and the thickness of the capping layer is 10 nm or less, the transmittance is 85% or more. When the thickness of the core layer is 20 nm or less and the thickness of the capping layer is 6 nm or less, it can be seen that the transmittance is 90% or more.

In addition, when the thickness of the core layer is 12 to 19 nm and the thickness of the capping layer is 10 nm or less, it can be seen that the reflectance is 0.04% or less.

Fourth Experimental Example

Figure 11:
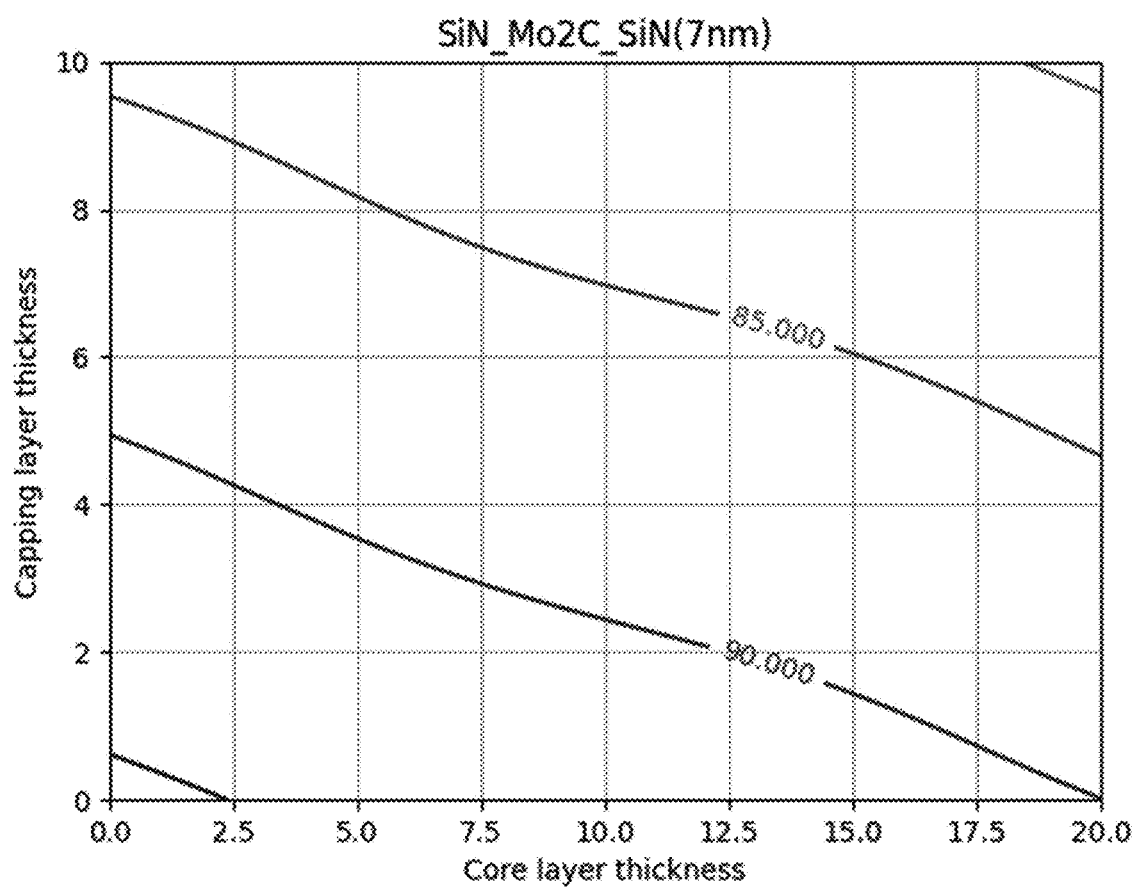
FIGS. 11 and 12 are graphs showing transmittance and reflectance of a pellicle for extreme ultraviolet lithography according to a fourth experimental example of the present disclosure.
Figure 12:
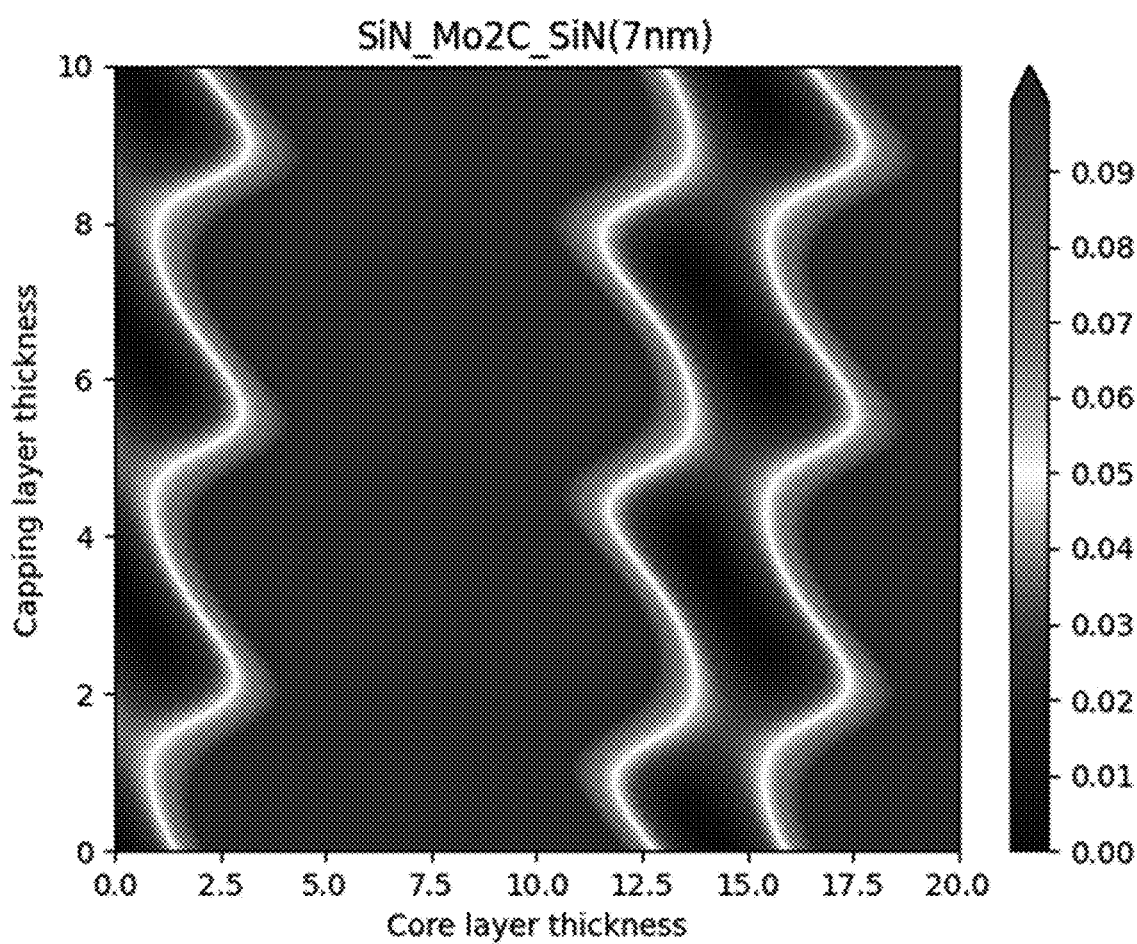

FIGS. 11 and 12 are graphs showing transmittance and reflectance of a pellicle for extreme ultraviolet lithography according to a fourth experimental example of the present disclosure. FIG. 11 shows the transmittance, and FIG. 12 shows the reflectance.

Referring to FIGS. 11 and 12, the pellicle according to the fourth experimental example was expressed as "SiN_Mo2C_SiN(7 nm)".

When the thickness of the core layer is 20 nm or less and the thickness of the capping layer is 10 nm or less, the transmittance is 85% or more. When the thickness of the core layer is 20 nm or less and the thickness of the capping layer is 5 nm or less, it can be seen that the transmittance is 90% or more.

In addition, when the thickness of the core layer is 12 to 17.5 nm and the thickness of the capping layer is 10 nm or less, it can be seen that the reflectance is 0.04% or less.

Fifth Experimental Example

Figure 13:
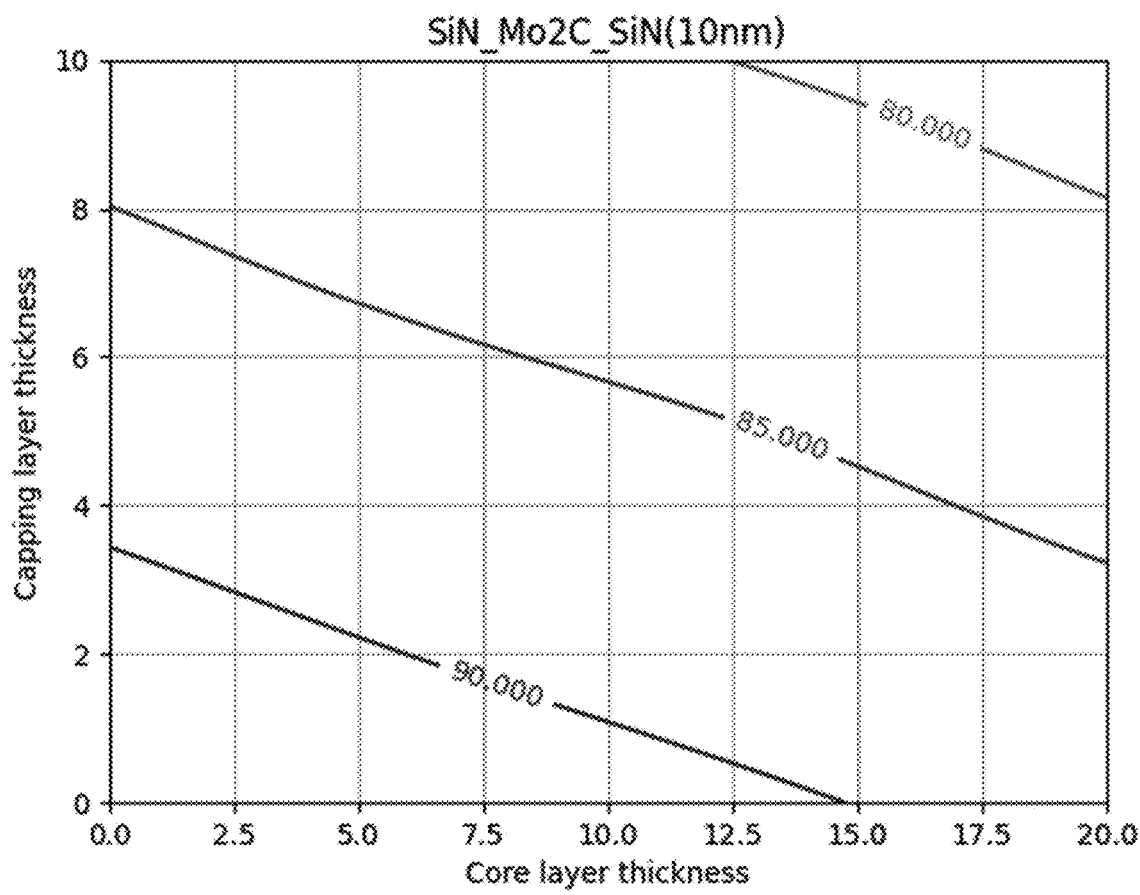
FIGS. 13 and 14 are graphs showing transmittance and reflectance of a pellicle for extreme ultraviolet lithography according to a fifth experimental example of the present disclosure.
Figure 14:
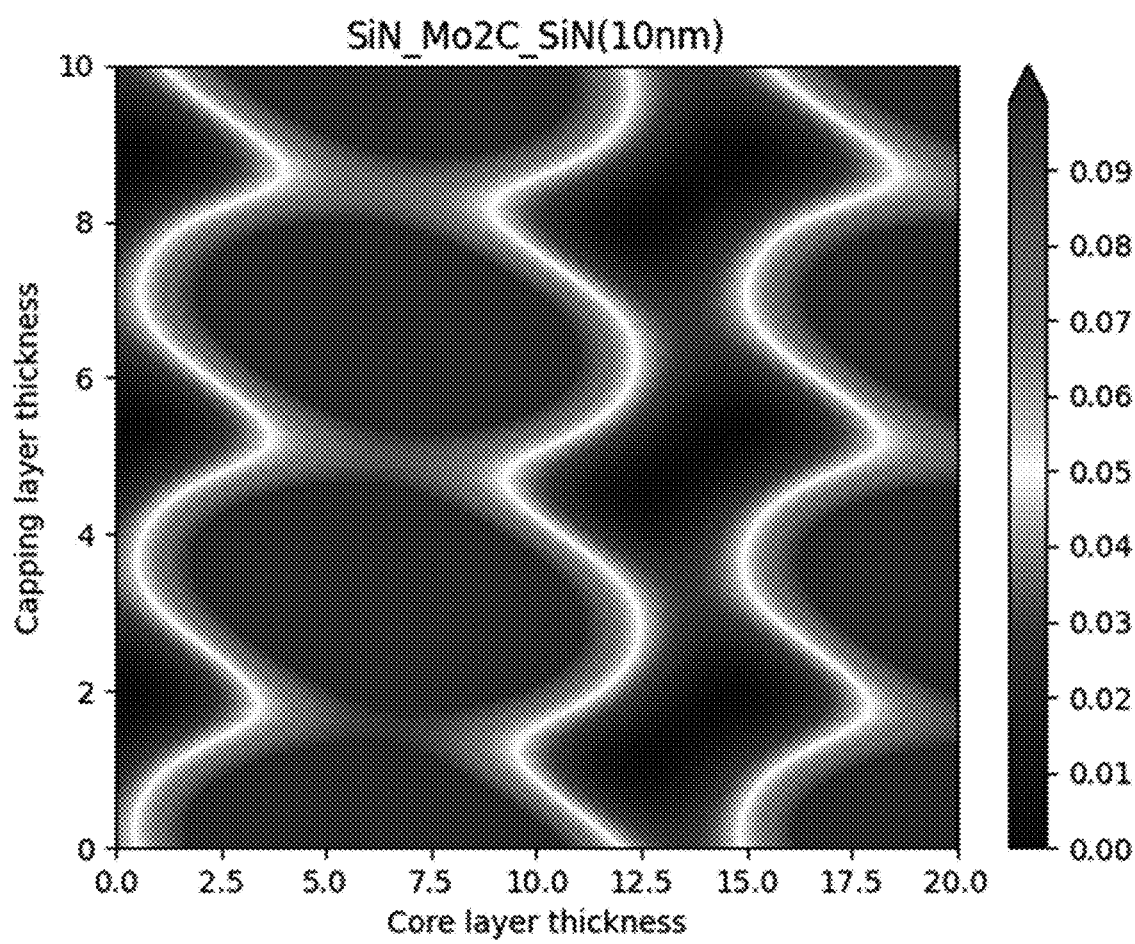

FIGS. 13 and 14 are graphs showing transmittance and reflectance of a pellicle for extreme ultraviolet lithography according to a fifth experimental example of the present disclosure. FIG. 13 shows the transmittance, and FIG. 14 shows the reflectance.

Referring to FIGS. 13 and 14, the pellicle according to the fifth experimental example was expressed as "SiN_Mo2C_SiN(10 nm)".

When the thickness of the core layer is 20 nm or less and the thickness of the capping layer is 8 nm or less, the transmittance is 85% or more. When the thickness of the core layer is 15 nm or less and the thickness of the capping layer is 3 nm or less, it can be seen that the transmittance is 90% or more.

In addition, when the thickness of the core layer is 10 to 17.5 nm and the thickness of the capping layer is 10 nm or less, it can be seen that the reflectance is 0.04% or less.

As such, according to the first to fifth experimental examples, in case that the capping layer is a SiN$_x$ layer and the core layer is a Mo$_2$C layer, it can be seen that it is possible to provide a pellicle having an extreme ultraviolet transmittance of 90% or more and a reflectance of 0.04% or less when the thickness of the core layer is formed to be 17.5 nm or less.

Sixth to Tenth Experimental Examples

FIGS. 15 to 24 are graphs showing transmittance and reflectance of pellicles according to sixth to tenth experimental examples of the present disclosure. The pellicle according to each of the sixth to tenth experimental examples includes the support layer, the core layer, and the capping layer. The material of the support layer is SiN$_x$. The material of the core layer is Mo$_2$C. The material of the capping layer is SiC.

When the thickness of the support layer is 0 nm, 3 nm, 5 nm, 7 nm, or 10 nm, the transmittance and reflectance of the pellicle according to each of the sixth to tenth experimental examples were simulated in an extreme ultraviolet output environment of 350 W while changing the thickness of the core layer between 0 nm and 20 nm and the thickness of the capping layer between 0 nm and 10 nm.

The pellicles according to the sixth to tenth experimental examples were expressed as "SiC_Mo2C_SiN(Xnm)". Here, 'SiN(Xnm)' denotes the support layer, and Xnm denotes that the thickness of the support layer is 0 nm, 3 nm, 5 nm, 7 nm, or 10 nm. Also, 'Mo2C' denotes the core layer, and 'SiC' denotes the capping layer.

Sixth Experimental Example

Figure 15:
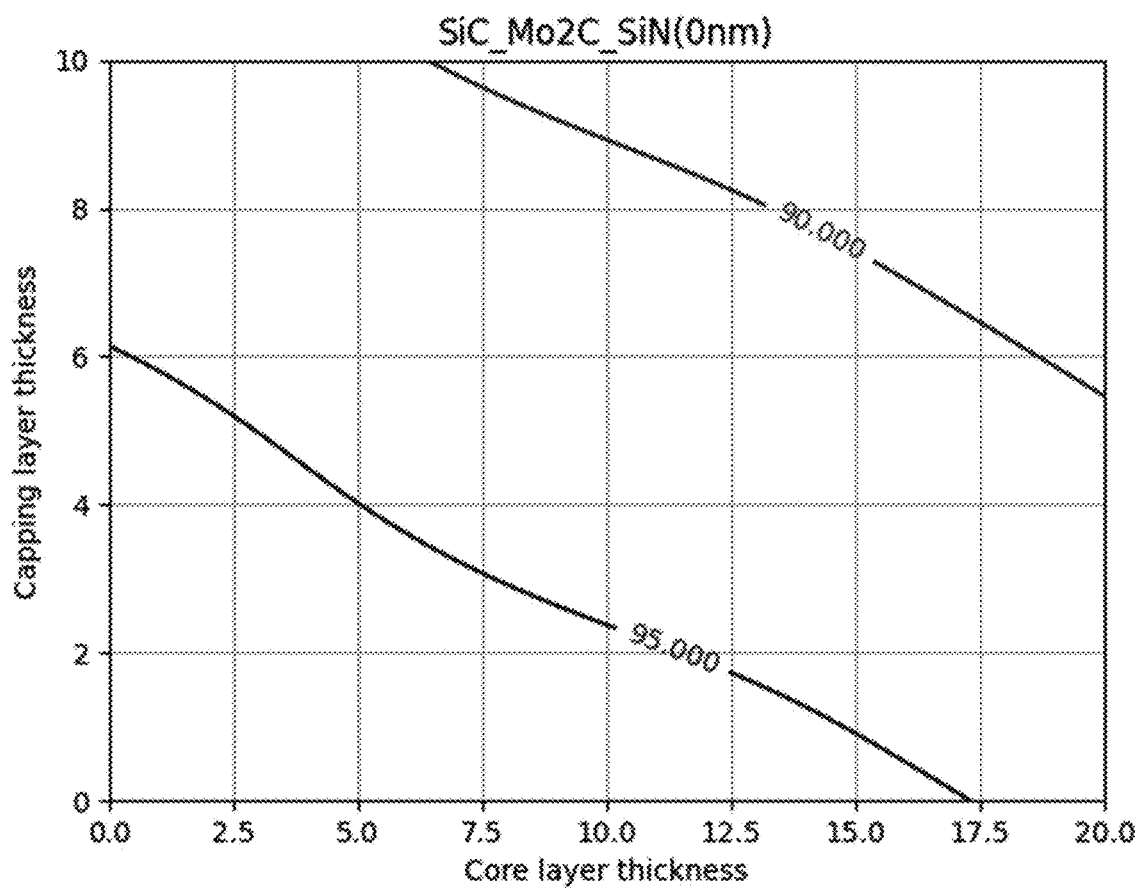
FIGS. 15 and 16 are graphs showing transmittance and reflectance of a pellicle for extreme ultraviolet lithography according to a sixth experimental example of the present disclosure.
Figure 16:
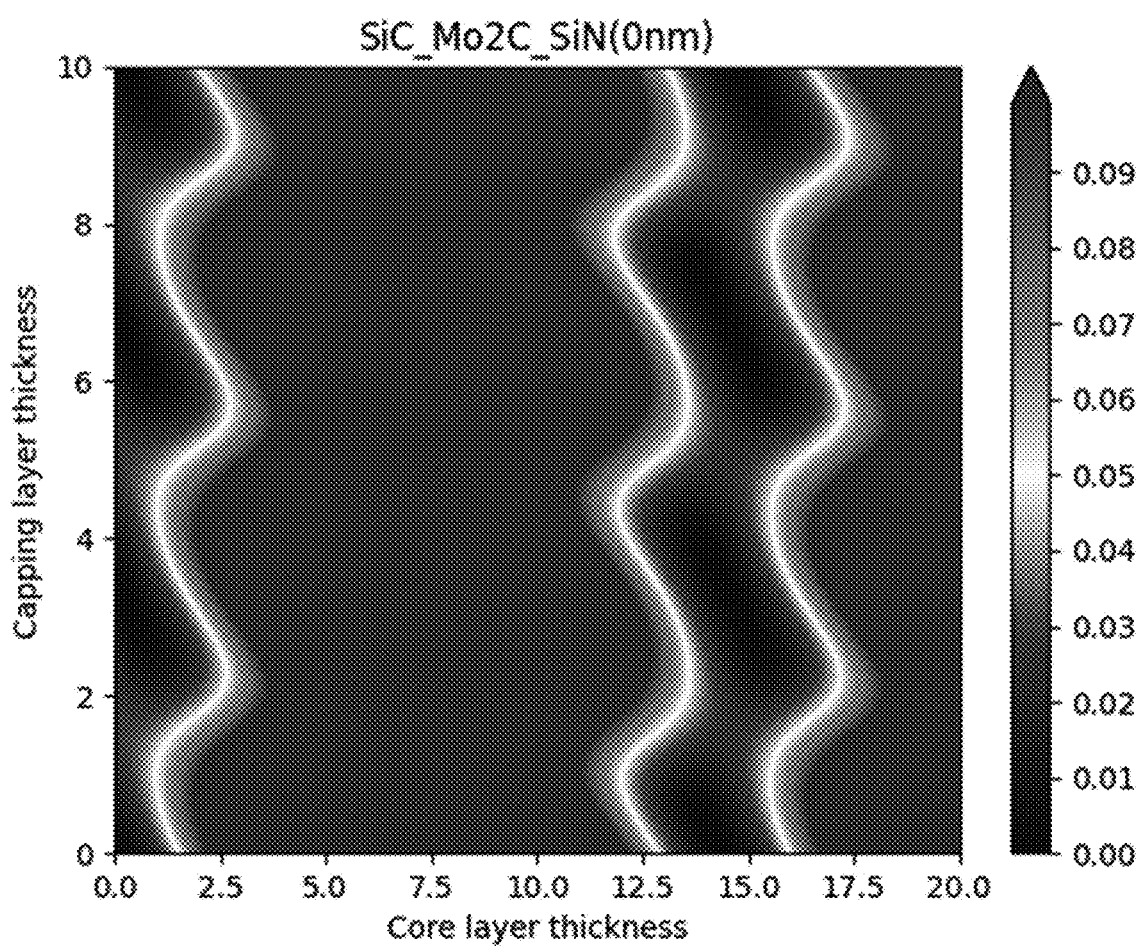

FIGS. 15 and 16 are graphs showing transmittance and reflectance of a pellicle for extreme ultraviolet lithography according to a sixth experimental example of the present disclosure. FIG. 15 shows the transmittance, and FIG. 16 shows the reflectance.

Referring to FIGS. 15 and 16, the pellicle according to the sixth experimental example was expressed as "SiC_Mo2C_SiN(0 nm)".

When the thickness of the core layer is 20 nm or less and the thickness of the capping layer is 10 nm or less, it can be seen that the transmittance is 90% or more.

In addition, when the thickness of the core layer is 12 to 17 nm and the thickness of the capping layer is 10 nm or less, it can be seen that the reflectance is 0.04% or less.

Seventh Experimental Example

Figure 17:
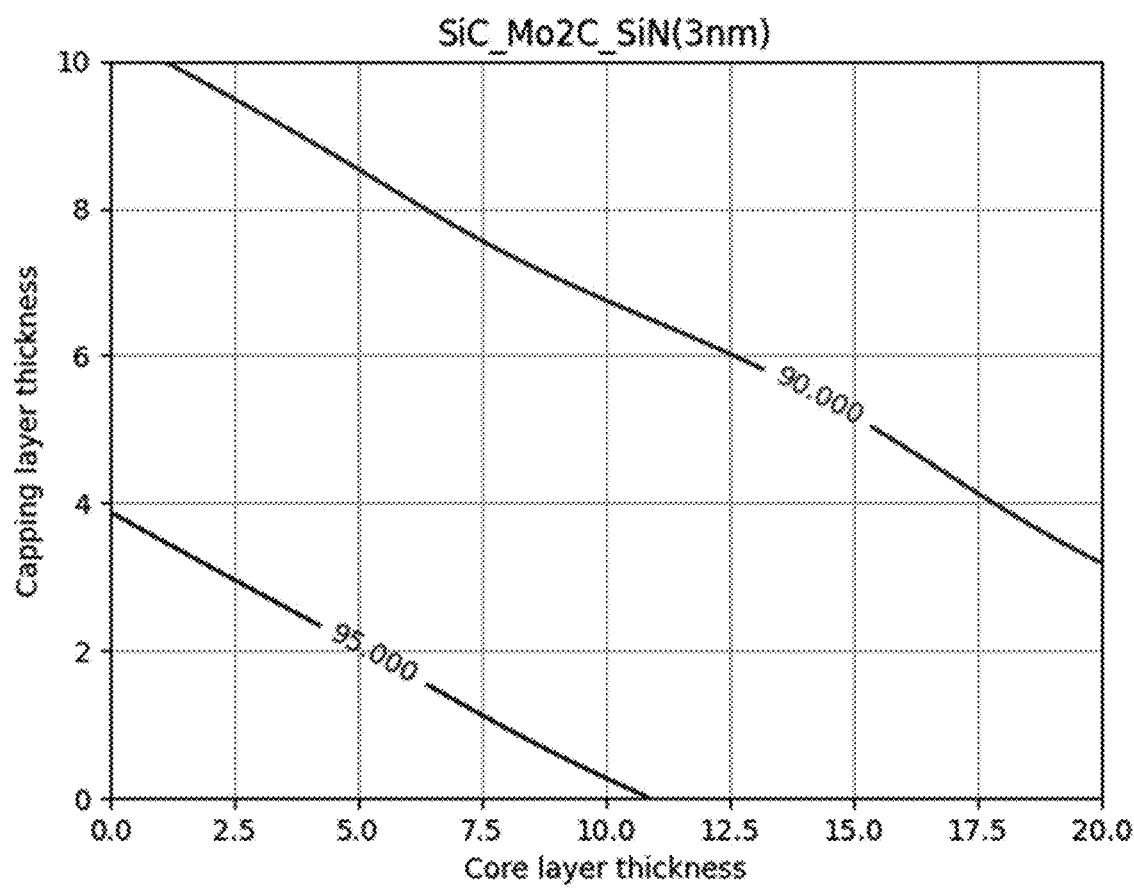
FIGS. 17 and 18 are graphs showing transmittance and reflectance of a pellicle for extreme ultraviolet lithography according to a seventh experimental example of the present disclosure.
Figure 18:
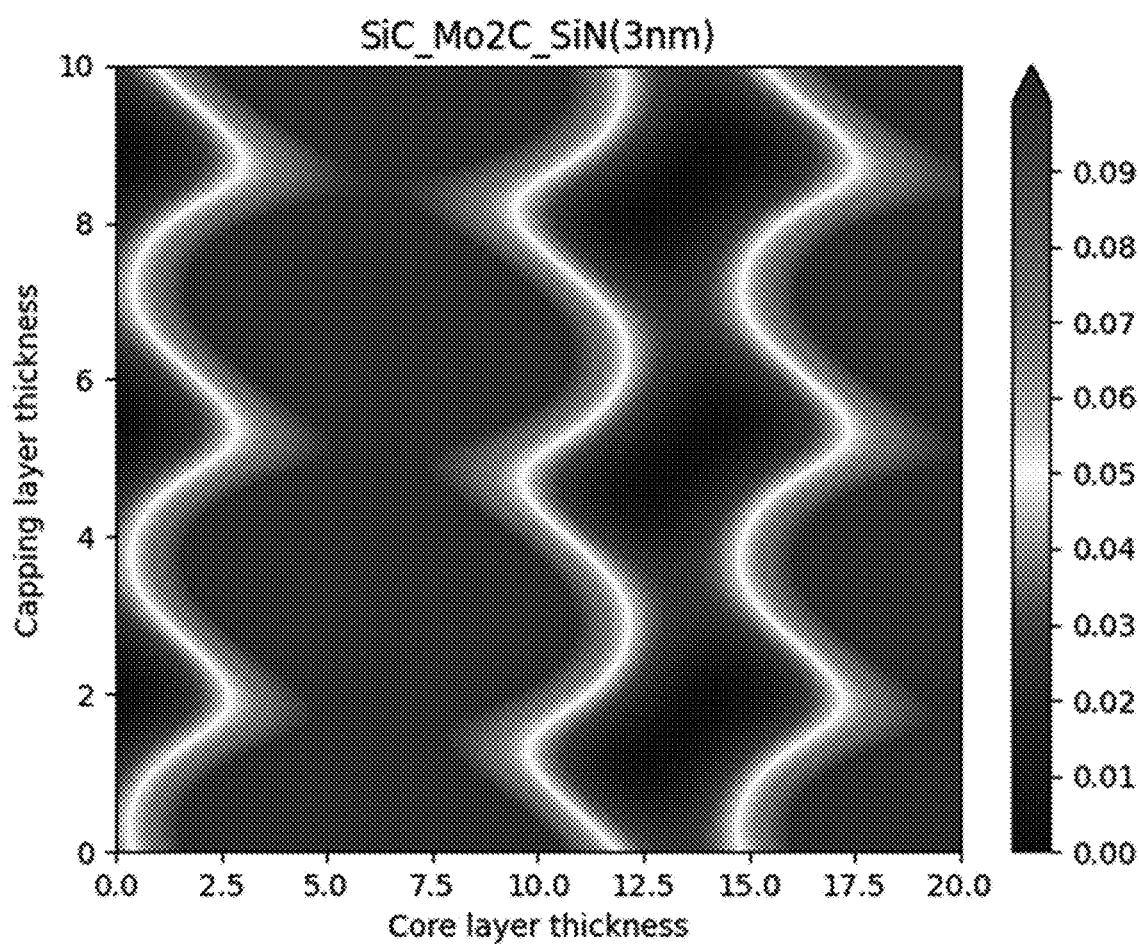

FIGS. 17 and 18 are graphs showing transmittance and reflectance of a pellicle for extreme ultraviolet lithography according to a seventh experimental example of the present disclosure. FIG. 17 shows the transmittance, and FIG. 18 shows the reflectance.

Referring to FIGS. 17 and 18, the pellicle according to the seventh experimental example was expressed as "SiC_Mo2C_SiN(3 nm)".

When the thickness of the core layer is 20 nm or less and the thickness of the capping layer is 10 nm or less, it can be seen that the transmittance is 90% or more.

In addition, when the thickness of the core layer is 10 to 17 nm and the thickness of the capping layer is 10 nm or less, it can be seen that the reflectance is 0.04% or less.

Eighth Experimental Example

Figure 19:
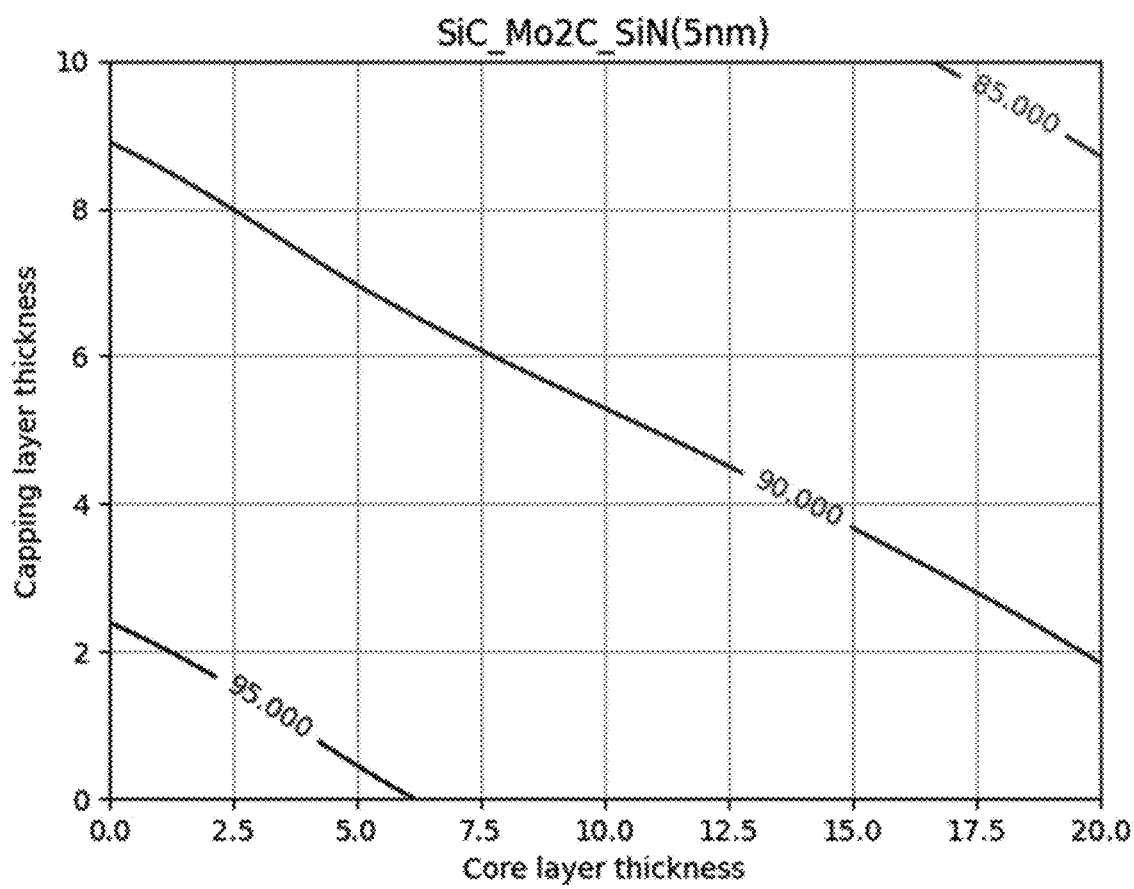
FIGS. 19 and 20 are graphs showing transmittance and reflectance of a pellicle for extreme ultraviolet lithography according to an eighth experimental example of the present disclosure.
Figure 20:
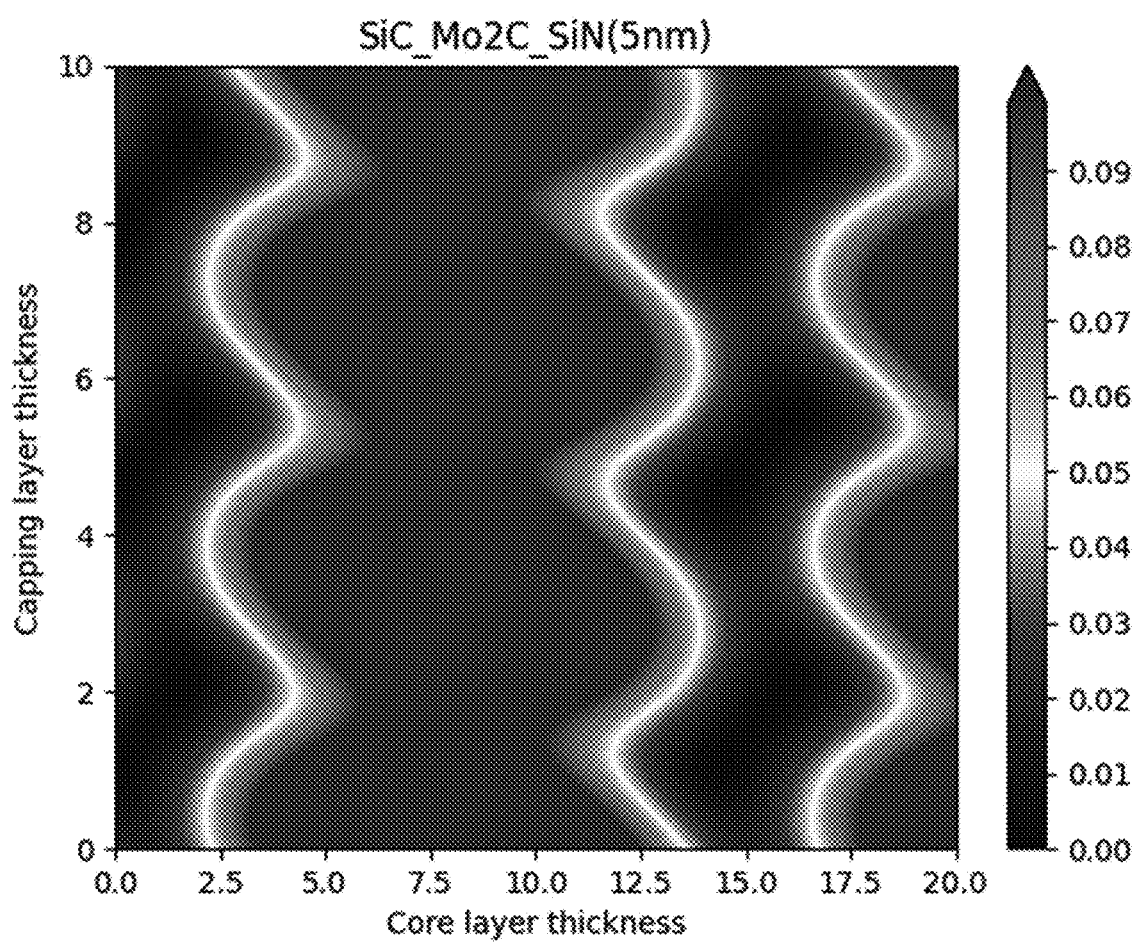

FIGS. 19 and 20 are graphs showing transmittance and reflectance of a pellicle for extreme ultraviolet lithography according to an eighth experimental example of the present disclosure. FIG. 19 shows the transmittance, and FIG. 20 shows the reflectance.

Referring to FIGS. 19 and 20, the pellicle according to the eighth experimental example was expressed as "SiC_Mo2C_SiN(5 nm)".

When the thickness of the core layer is 20 nm or less and the thickness of the capping layer is 9 nm or less, it can be seen that the transmittance is 90% or more.

In addition, when the thickness of the core layer is 12 to 19 nm and the thickness of the capping layer is 10 nm or less, it can be seen that the reflectance is 0.04% or less.

Ninth Experimental Example

Figure 21:
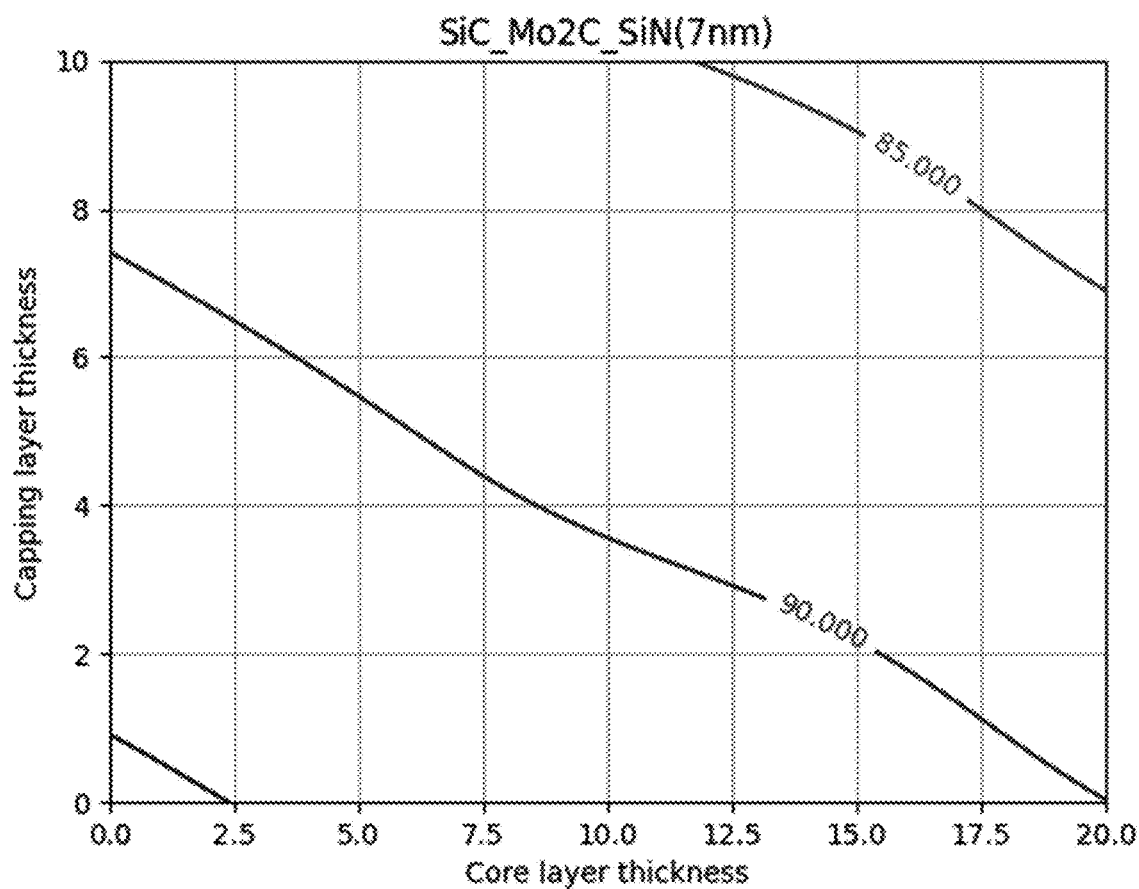
FIGS. 21 and 22 are graphs showing transmittance and reflectance of a pellicle for extreme ultraviolet lithography according to a ninth experimental example of the present disclosure.
Figure 22:
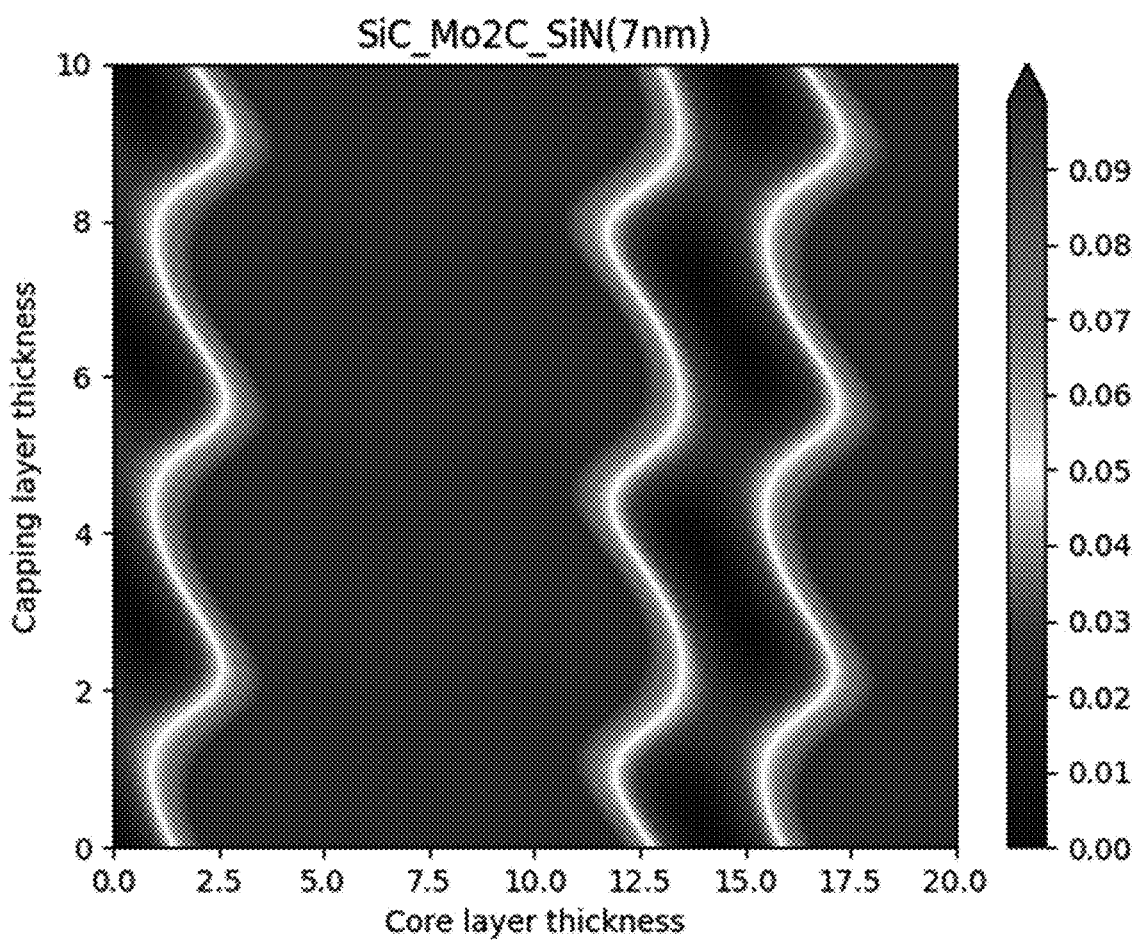

FIGS. 21 and 22 are graphs showing transmittance and reflectance of a pellicle for extreme ultraviolet lithography according to a ninth experimental example of the present disclosure. FIG. 21 shows the transmittance, and FIG. 22 shows the reflectance.

Referring to FIGS. 21 and 22, the pellicle according to the ninth experimental example was expressed as "SiC_Mo2C_SiN(7 nm)".

When the thickness of the core layer is 20 nm or less and the thickness of the capping layer is 8 nm or less, it can be seen that the transmittance is 90% or more.

In addition, when the thickness of the core layer is 12 to 17 nm and the thickness of the capping layer is 10 nm or less, it can be seen that the reflectance is 0.04% or less.

Tenth Experimental Example

Figure 23:
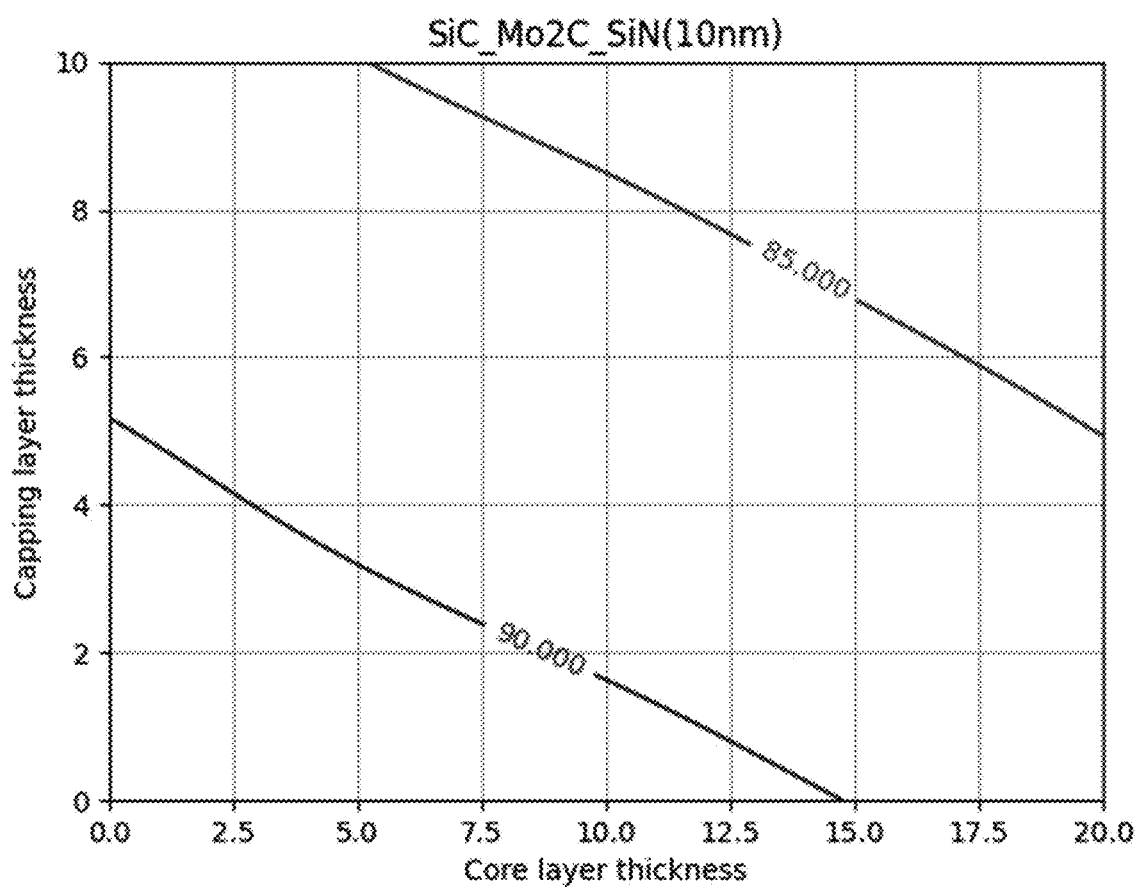
FIGS. 23 and 24 are graphs showing transmittance and reflectance of a pellicle for extreme ultraviolet lithography according to a tenth experimental example of the present disclosure.
Figure 24:
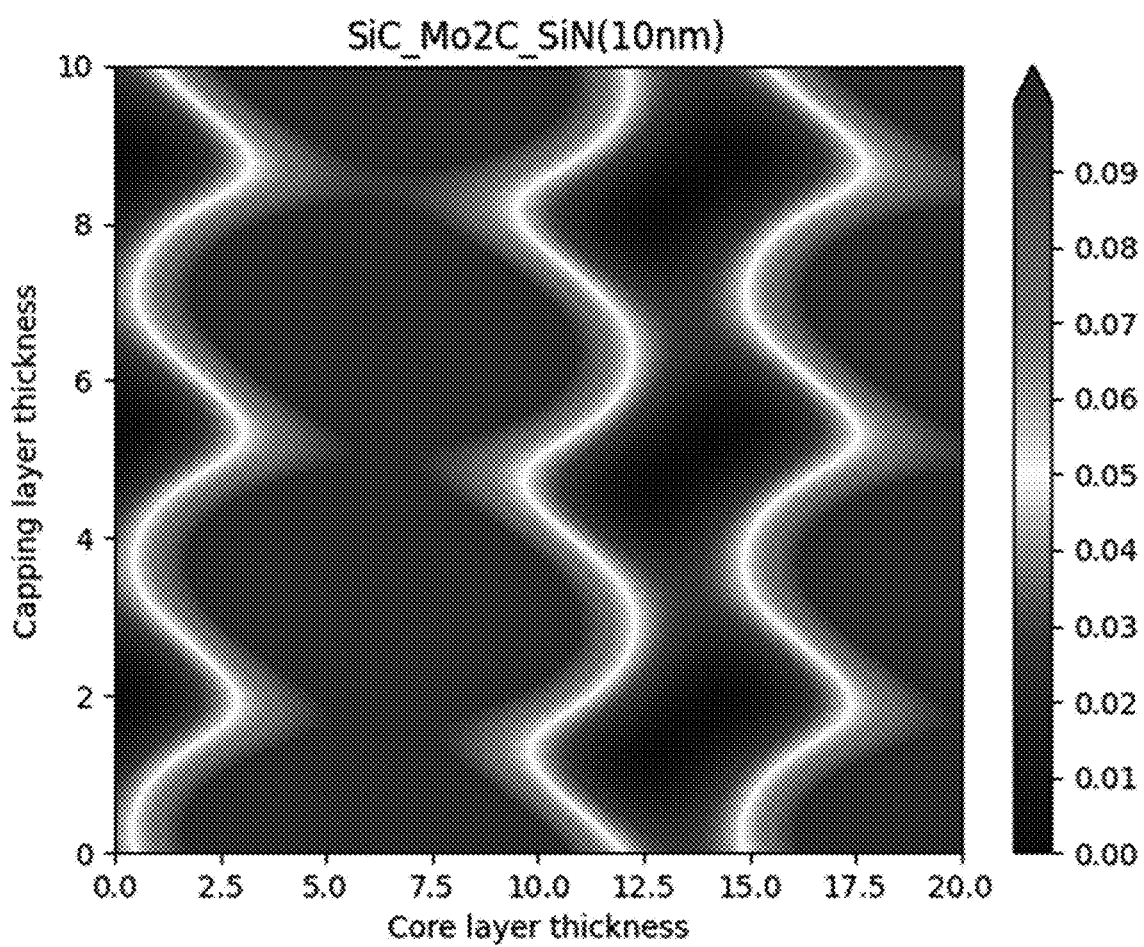

FIGS. 23 and 24 are graphs showing transmittance and reflectance of a pellicle for extreme ultraviolet lithography according to a tenth experimental example of the present disclosure. FIG. 23 shows the transmittance, and FIG. 24 shows the reflectance.

Referring to FIGS. 23 and 24, the pellicle according to the tenth experimental example was expressed as "SiC_Mo2C_SiN(10 nm)".

When the thickness of the core layer is 15 nm or less and the thickness of the capping layer is 5 nm or less, it can be seen that the transmittance is 90% or more.

In addition, when the thickness of the core layer is 10 to 17 nm and the thickness of the capping layer is 10 nm or less, it can be seen that the reflectance is 0.04% or less.

As such, according to the sixth to tenth experimental examples, in case that the capping layer is a SiC layer and the core layer is a $Mo_2C$ layer, it can be seen that it is possible to provide a pellicle having an extreme ultraviolet transmittance of 90% or more and a reflectance of 0.04% or less when the thickness of the core layer is formed to be about 15 nm.

Eleventh to Fifteenth Experimental Examples

FIGS. 25 to 34 are graphs showing transmittance and reflectance of pellicles according to eleventh to fifteenth experimental examples of the present disclosure.

The pellicle according to each of the eleventh to fifteenth experimental examples includes the support layer, the core layer, and the capping layer. The material of the support layer is $SiN_x$. The material of the core layer is $Mo_2C$. The material of the capping layer is $MoSi_2$.

When the thickness of the support layer is 0 nm, 3 nm, 5 nm, 7 nm, or 10 nm, the transmittance and reflectance of the pellicle according to each of the eleventh to fifteenth experimental examples were simulated in an extreme ultraviolet output environment of 350 W while changing the thickness of the core layer between 0 nm and 20 nm and the thickness of the capping layer between 0 nm and 10 nm.

The pellicles according to the eleventh to fifteenth experimental examples were expressed as "MoSi2_Mo2C_SiN(Xnm)". Here, 'SiN(Xnm)' denotes the support layer, and Xnm denotes that the thickness of the support layer is 0 nm, 3 nm, 5 nm, 7 nm, or 10 nm. Also, 'Mo2C' denotes the core layer, and 'MoSi2' denotes the capping layer.

Eleventh Experimental Example

Figure 25:
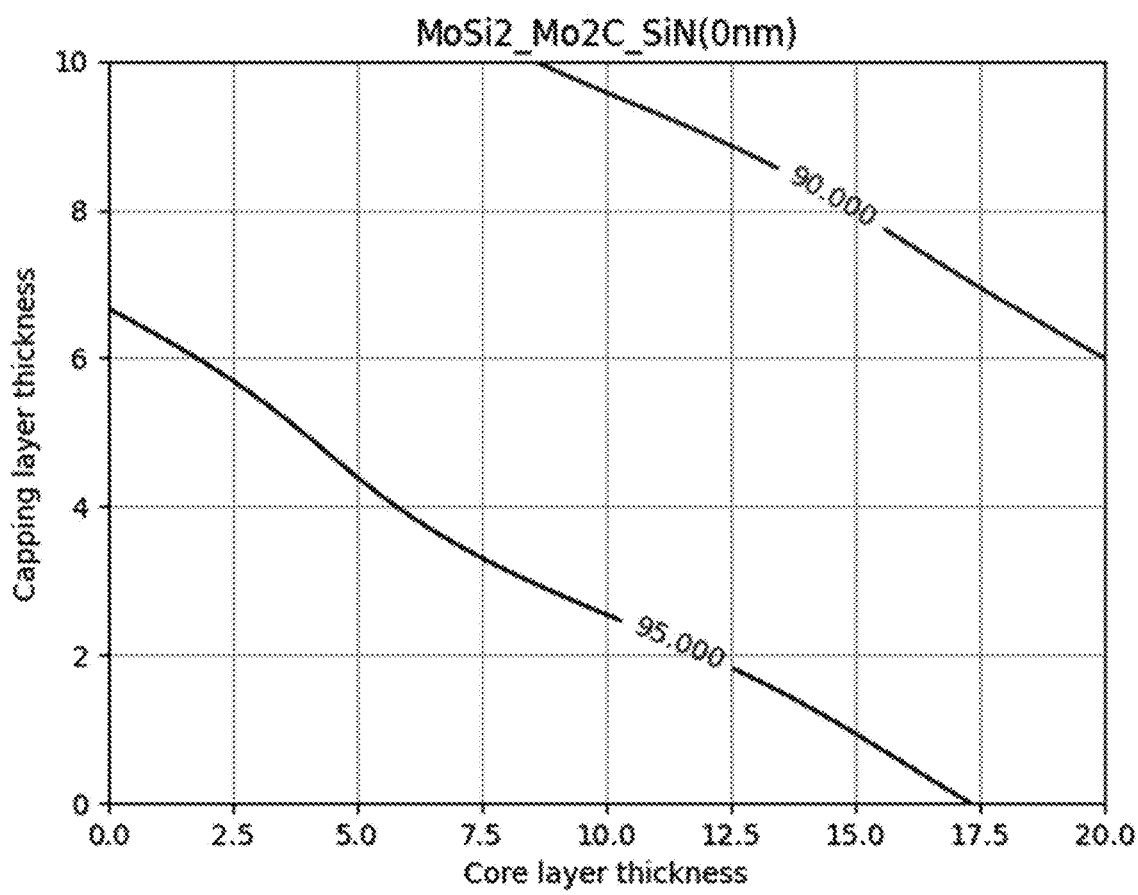
FIGS. 25 and 26 are graphs showing transmittance and reflectance of a pellicle for extreme ultraviolet lithography according to an eleventh experimental example of the present disclosure.
Figure 26:
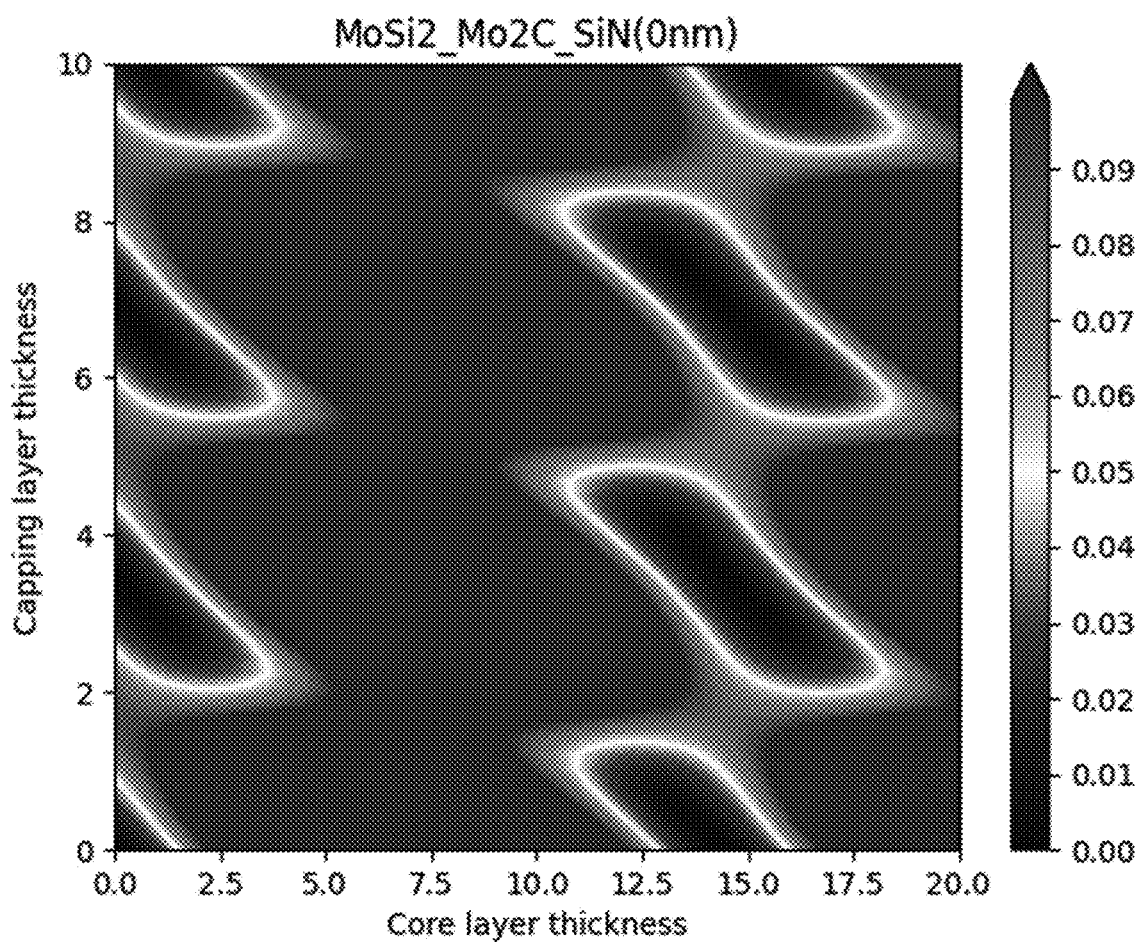

FIGS. 25 and 26 are graphs showing transmittance and reflectance of a pellicle for extreme ultraviolet lithography according to an eleventh experimental example of the present disclosure. FIG. 25 shows the transmittance, and FIG. 26 shows the reflectance.

Referring to FIGS. 25 and 26, the pellicle according to the eleventh experimental example was expressed as "MoSi2_Mo2C_SiN(0 nm)".

When the thickness of the core layer is 20 nm or less and the thickness of the capping layer is 10 nm or less, it can be seen that the transmittance is 90% or more.

In addition, when the thickness of the core layer is 11 to 17 nm and the thickness of the capping layer is 10 nm or less, it can be seen that the reflectance is 0.04% or less.

Twelfth Experimental Example

Figure 27:
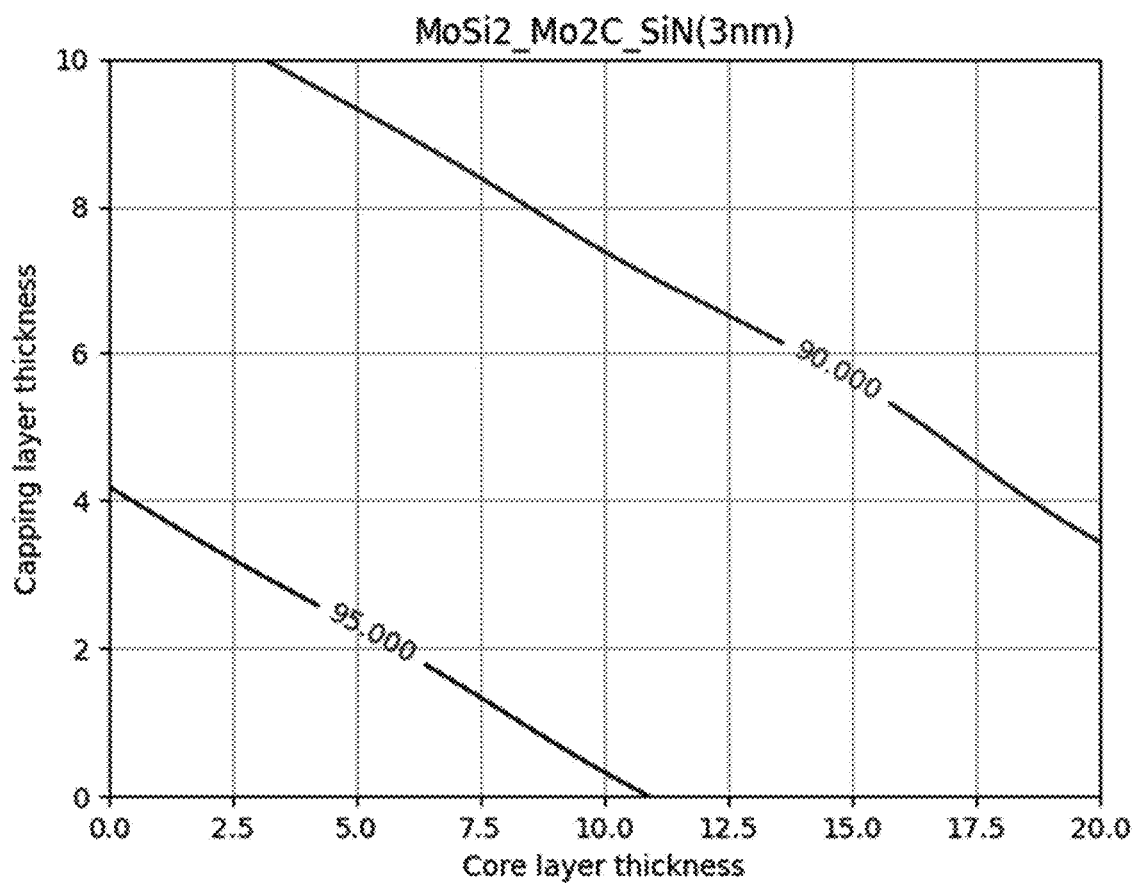
FIGS. 27 and 28 are graphs showing transmittance and reflectance of a pellicle for extreme ultraviolet lithography according to a twelfth experimental example of the present disclosure.
Figure 28:
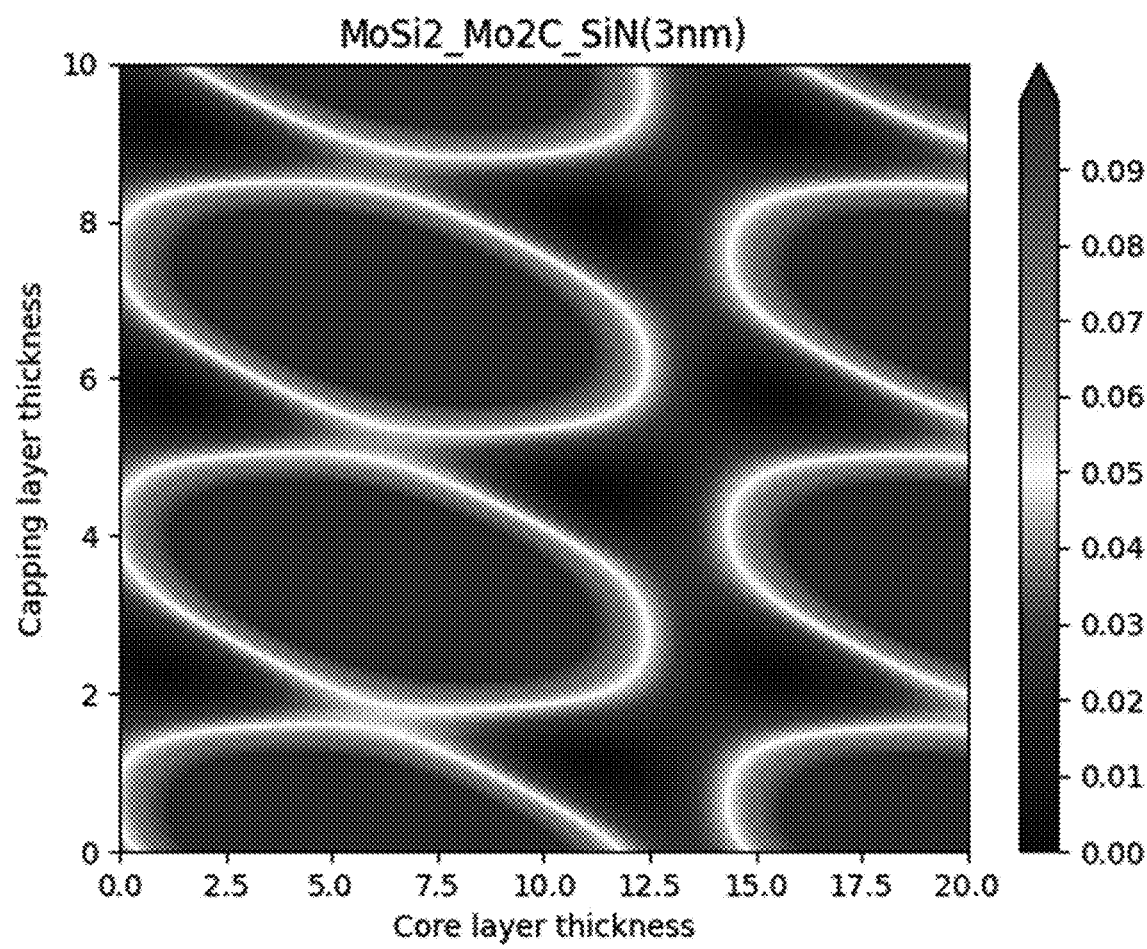

FIGS. 27 and 28 are graphs showing transmittance and reflectance of a pellicle for extreme ultraviolet lithography according to a twelfth experimental example of the present disclosure. FIG. 27 shows the transmittance, and FIG. 28 shows the reflectance.

Referring to FIGS. 27 and 28, the pellicle according to the twelfth experimental example was expressed as "MoSi2_Mo2C_SiN(3 nm)".

When the thickness of the core layer is 20 nm or less and the thickness of the capping layer is 10 nm or less, it can be seen that the transmittance is 90% or more.

In addition, when the thickness of the core layer is 12 to 20 nm, it can be seen that the reflectance is 0.04% or less discontinuously in the thickness of the capping layer of 10 nm or less. When the thickness of the core layer is 12 to 15 nm and the thickness of the capping layer is 10 nm or less, it can be seen that the reflectance is 0.04% or less.

Thirteenth Experimental Example

Figure 29:
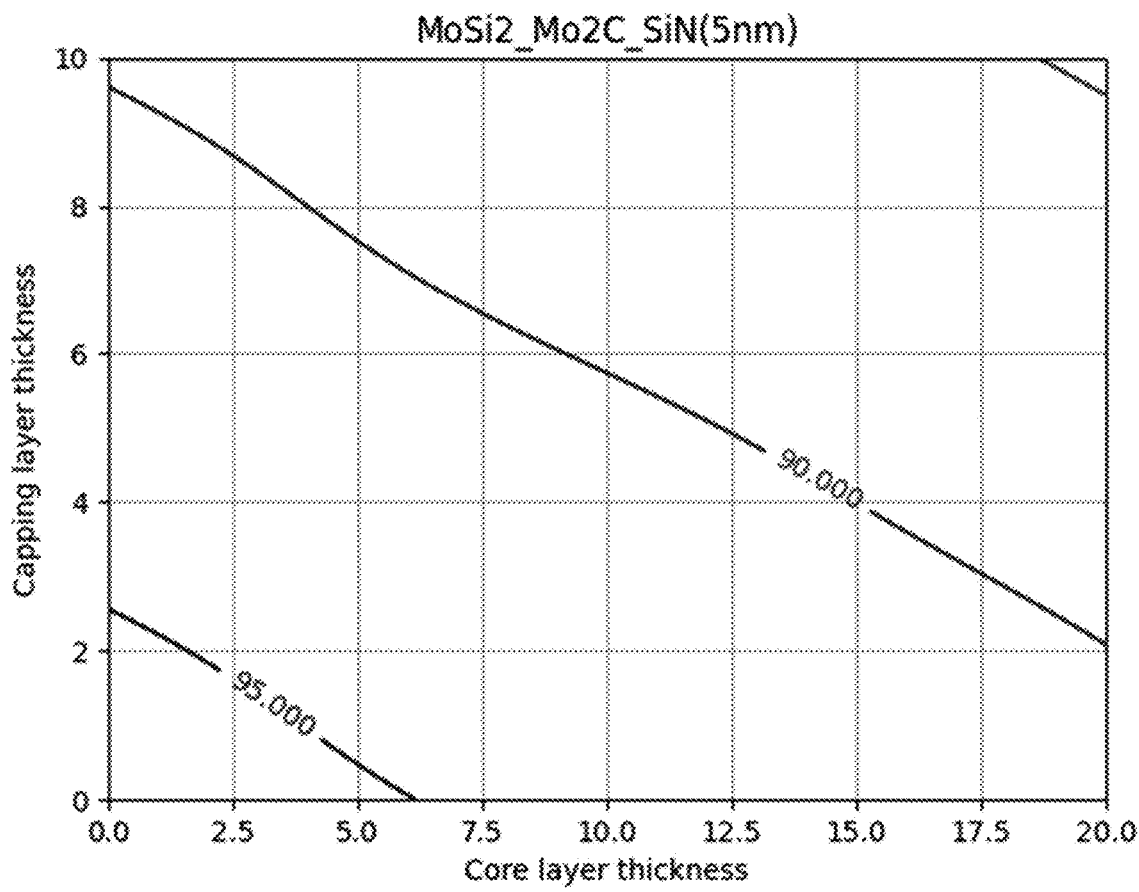
FIGS. 29 and 30 are graphs showing transmittance and reflectance of a pellicle for extreme ultraviolet lithography according to a thirteenth experimental example of the present disclosure.
Figure 30:
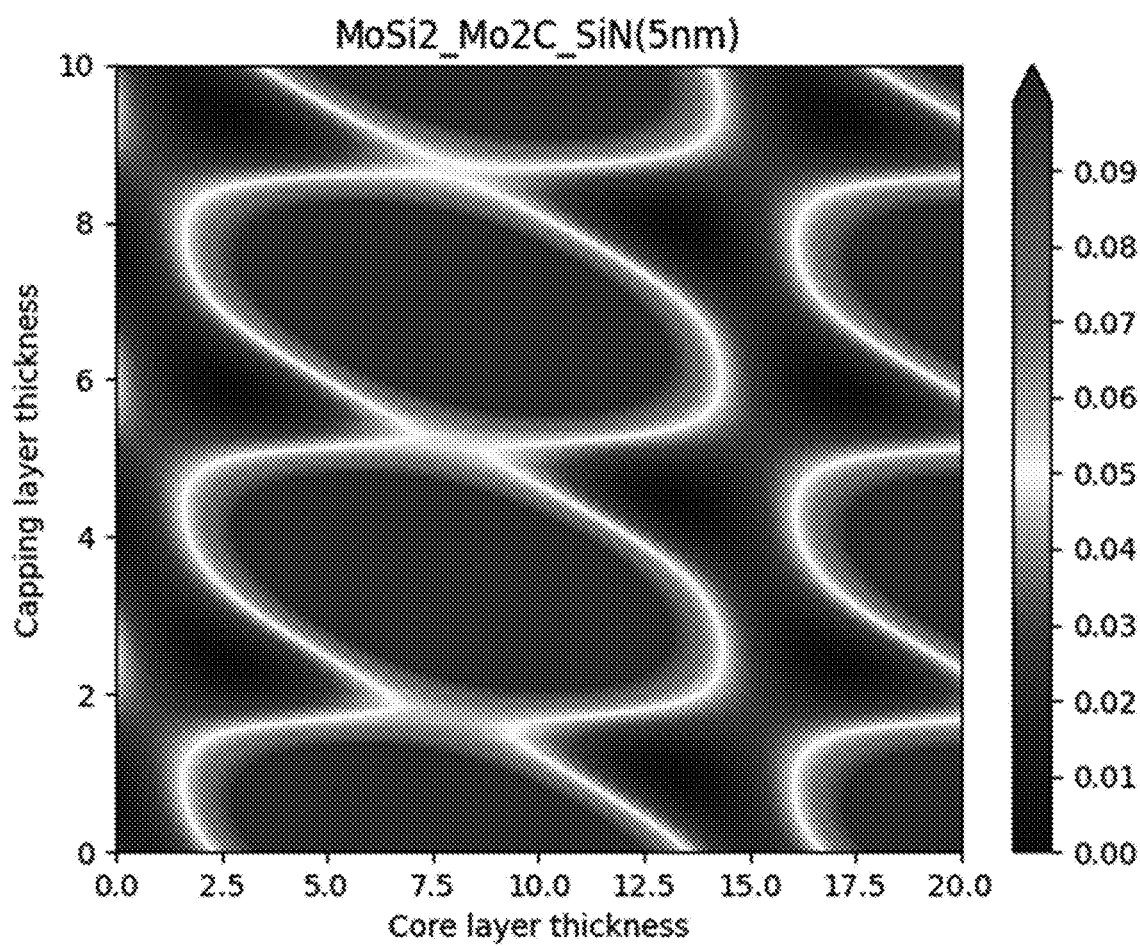

FIGS. 29 and 30 are graphs showing transmittance and reflectance of a pellicle for extreme ultraviolet lithography according to a thirteenth experimental example of the present disclosure. FIG. 29 shows the transmittance, and FIG. 30 shows the reflectance.

Referring to FIGS. 29 and 30, the pellicle according to the thirteenth experimental example was expressed as "MoSi2_Mo2C_SiN(5 nm)".

When the thickness of the core layer is 20 nm or less and the thickness of the capping layer is 10 nm or less, it can be seen that the transmittance is 90% or more.

In addition, when the thickness of the core layer is 8 to 20 nm, it can be seen that the reflectance is 0.04% or less discontinuously in the thickness of the capping layer of 10 nm or less. When the thickness of the core layer is about 15 nm and the thickness of the capping layer is 10 nm or less, it can be seen that the reflectance is 0.04% or less.

Fourteenth Experimental Example

Figure 31:
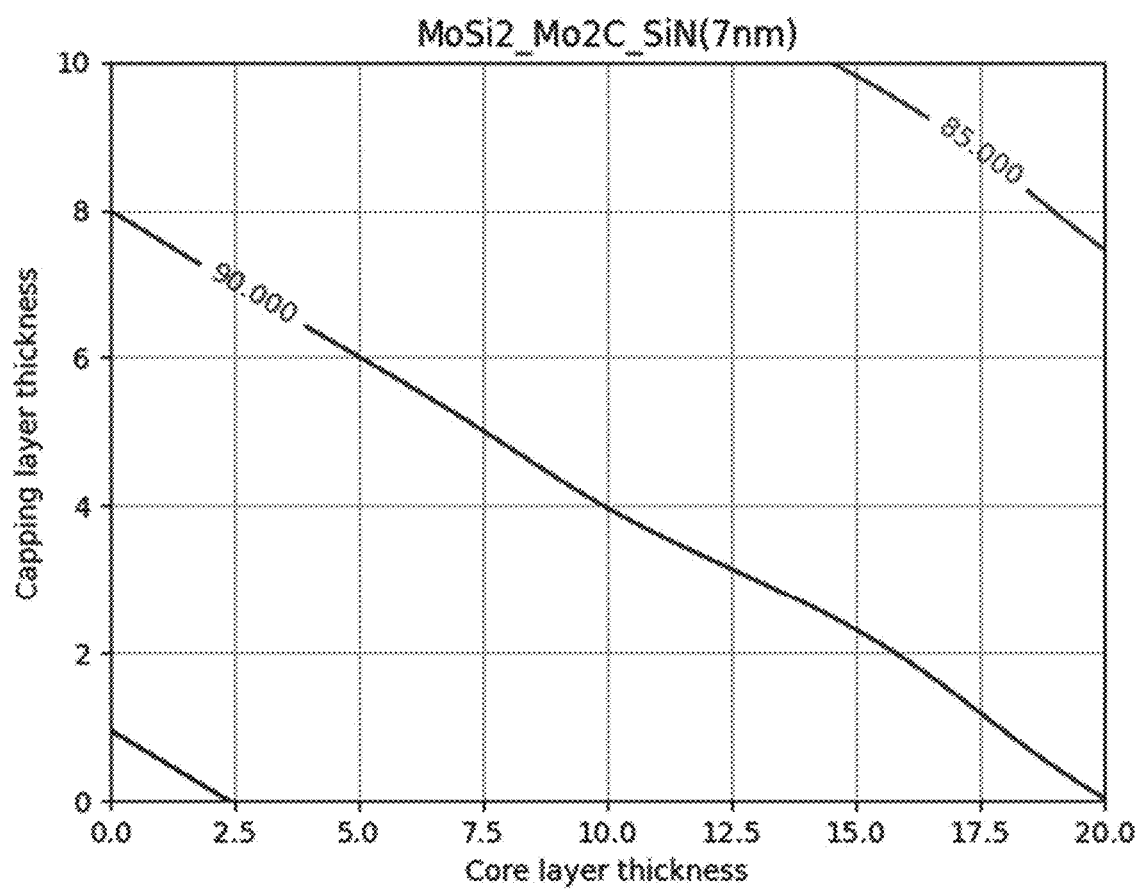
FIGS. 31 and 32 are graphs showing transmittance and reflectance of a pellicle for extreme ultraviolet lithography according to a fourteenth experimental example of the present disclosure.
Figure 32:
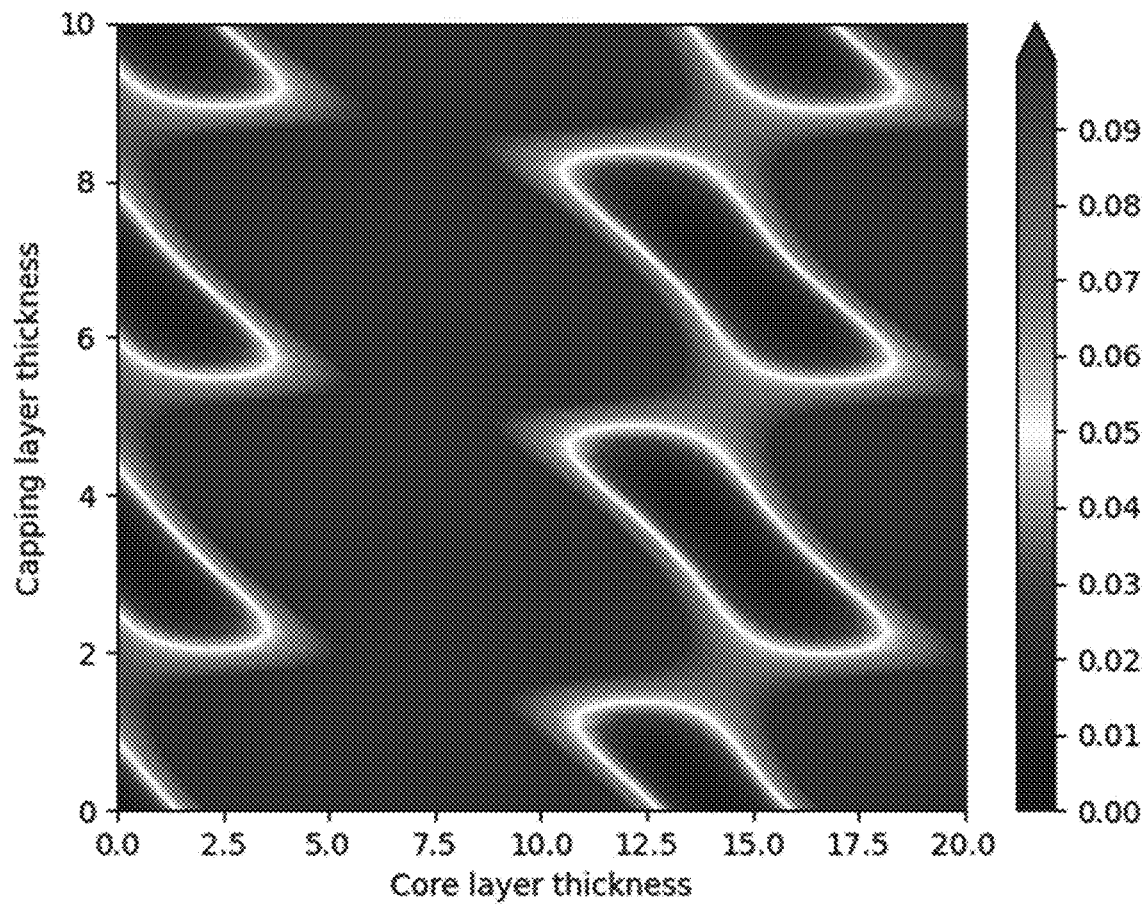

FIGS. 31 and 32 are graphs showing transmittance and reflectance of a pellicle for extreme ultraviolet lithography according to a fourteenth experimental example of the present disclosure. FIG. 31 shows the transmittance, and FIG. 32 shows the reflectance.

Referring to FIGS. 31 and 32, the pellicle according to the fourteenth experimental example was expressed as "MoSi2_Mo2C_SiN(7 nm)".

When the thickness of the core layer is 20 nm or less and the thickness of the capping layer is 8 nm or less, it can be seen that the transmittance is 90% or more.

In addition, when the thickness of the core layer is 11 to 18 nm and the thickness of the capping layer is 10 nm or less, it can be seen that the reflectance is 0.04% or less.

Also, when the thickness of the core layer is 11 to 18 nm, it can be seen that the reflectance is 0.04% or less discontinuously in the thickness of the capping layer of 10 nm or less.

Fifteenth Experimental Example

Figure 33:
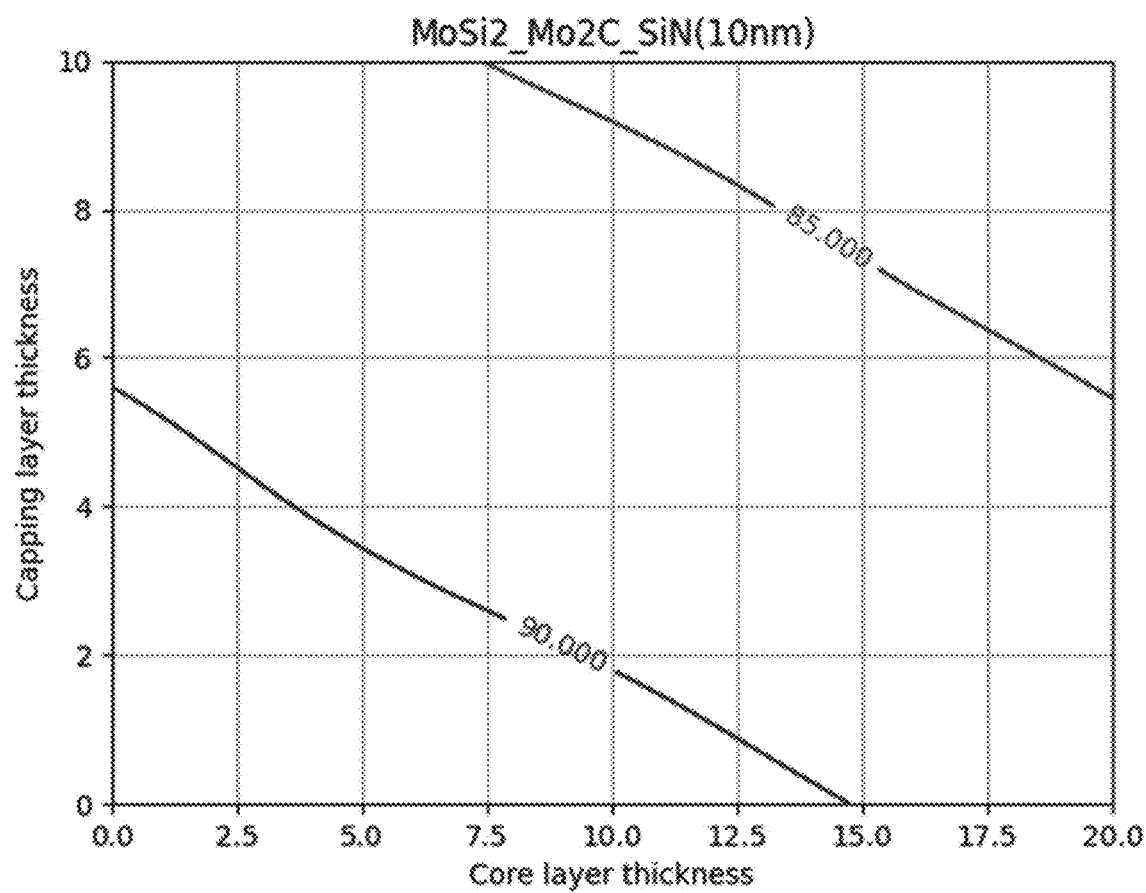
FIGS. 33 and 34 are graphs showing transmittance and reflectance of a pellicle for extreme ultraviolet lithography according to a fifteenth experimental example of the present disclosure.
Figure 34:
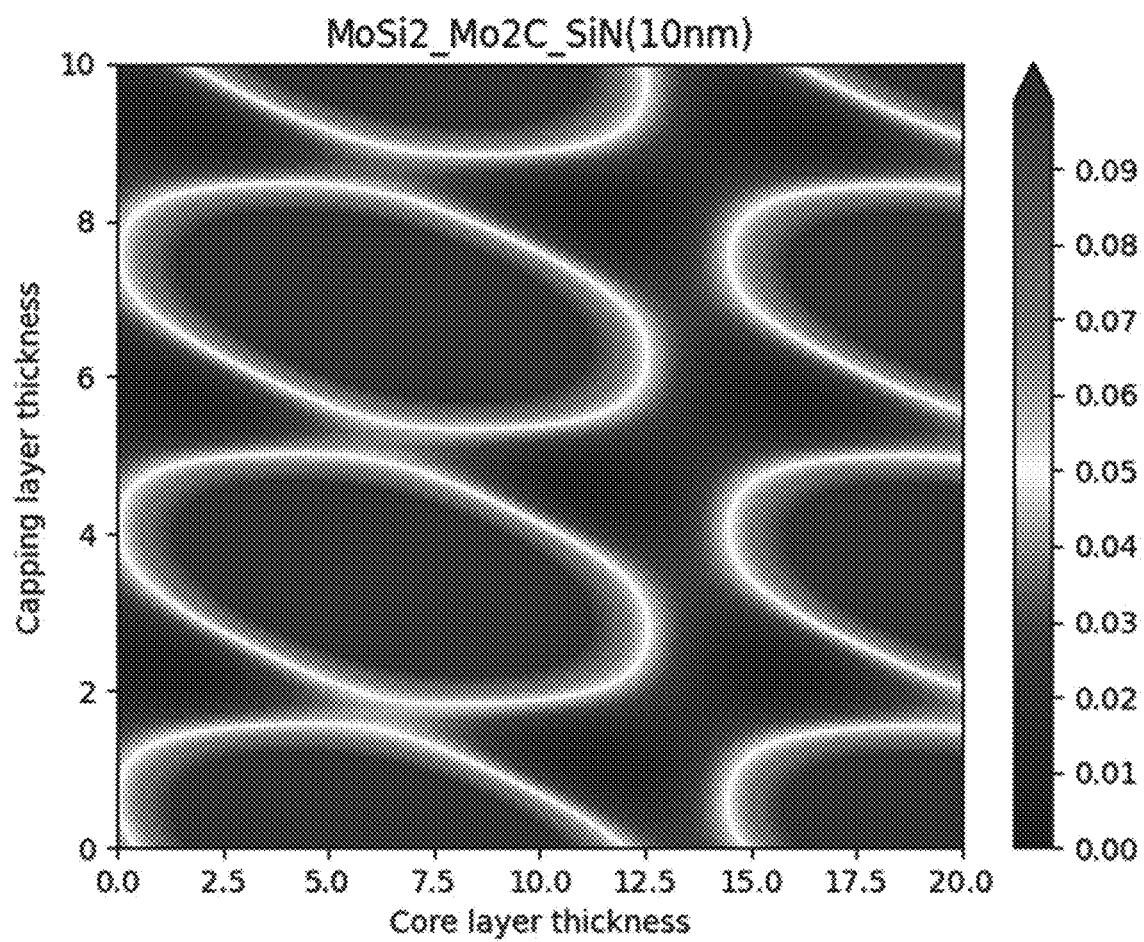

FIGS. 33 and 34 are graphs showing transmittance and reflectance of a pellicle for extreme ultraviolet lithography according to a fifteenth experimental example of the present disclosure. FIG. 33 shows the transmittance, and FIG. 34 shows the reflectance.

Referring to FIGS. 33 and 34, the pellicle according to the fifteenth experimental example was expressed as "MoSi2_Mo2C_SiN(10 nm)".

When the thickness of the core layer is 15 nm or less and the thickness of the capping layer is 6 nm or less, it can be seen that the transmittance is 90% or more.

In addition, when the thickness of the core layer is 8 to 20 nm, it can be seen that the reflectance is 0.04% or less discontinuously in the thickness of the capping layer of 10 nm or less. When the thickness of the core layer is 13 to 15 nm and the thickness of the capping layer is 10 nm or less, it can be seen that the reflectance is 0.04% or less.

As such, according to the eleventh to fifteenth experimental examples, in case that the capping layer is a $MoSi_2$ layer and the core layer is a $Mo_2C$ layer, it can be seen that it is possible to provide a pellicle having an extreme ultraviolet transmittance of 90% or more and a reflectance of 0.04% or less when the thickness of the core layer is formed to be about 15 nm.

While the present disclosure has been particularly shown and described with reference to an exemplary embodiment thereof, it will be understood by those skilled in the art that various changes in form and details may be made therein without departing from the scope of the present disclosure as defined by the appended claims.

What is claimed is:

1. A pellicle for extreme ultraviolet lithography, the pellicle comprising:
   a substrate having an opening formed in a central portion; and
   a pellicle layer formed over the substrate to cover the opening and including a molybdenum carbide containing layer that contains molybdenum carbide expressed as $MoC_{1-x}$, wherein x is equal to or greater than 0.5 and smaller than 1,
   the pellicle layer including:
      a core layer formed over the substrate to cover the opening,
      wherein the core layer is the molybdenum carbide containing layer.

2. The pellicle of claim 1, wherein the molybdenum carbide containing layer contains crystalline or amorphous molybdenum carbide.

3. The pellicle of claim 1, wherein the molybdenum carbide containing layer contains $Mo_2C$.

4. The pellicle of claim 1, wherein the pellicle layer further includes:
   a capping layer formed over the core layer such that the core layer is disposed between the substrate and the capping layer.

5. The pellicle of claim 4, wherein the capping layer includes at least one of nitride, oxide, boride, carbide, or silicide.

6. The pellicle of claim 4, wherein the capping layer contains molybdenum carbide.

7. The pellicle of claim 1, further comprising:
a support layer interposed between the substrate and the pellicle layer to cover the opening, and formed of a material including at least one of $SiN_x$, $SiO_2$, SiC, or $Mo_2C$.

8. The pellicle of claim 1, wherein the pellicle layer further includes:
a capping layer formed over the core layer such that the core layer is disposed between the substrate and the capping layer; and
a buffer layer formed at least one of between the substrate and the core layer or between the core layer and the capping layer.

9. The pellicle of claim 8, wherein at least one of the capping layer or the buffer layer contains molybdenum carbide.

10. The pellicle of claim 9, wherein the buffer layer contains molybdenum carbide, and the capping layer includes at least one of nitride, oxide, boride, carbide, or silicide.

11. The pellicle of claim 9, wherein the capping layer contains molybdenum carbide, and the buffer layer includes at least one of B, C, Zr, $B_4C$, BN, $SiN_x$ ($x≥1$), $MoSi_2$, RuC, $NbC_x$ ($0<x≤1$), $YC_x$ ($0.5≤x≤2$), $ZrSi_x$ ($x≤2$), $ZrC_x$ ($0.3≤x≤1$), $ZrB_x$ ($2<x<16$), $ZrB_xSi_y$ ($x≥2$, $y≥2$), $ZrC_xB_y$ ($0.8≤x≤1.2$, $y≥2$), or $ZrC_xSi$ ($0.8≤x≤1.2$, $y≤2$).

12. A pellicle for extreme ultraviolet lithography, the pellicle comprising:
a pellicle layer including a molybdenum carbide containing layer that contains molybdenum carbide expressed as $MoC_{1-x}$, wherein x is equal to or greater than 0.5 and smaller than 1,
the pellicle layer including:
a core layer formed over a substrate to cover an opening of the substrate,
wherein the core layer is the molybdenum carbide containing layer.

13. The pellicle of claim 12, wherein the molybdenum carbide containing layer contains crystalline or amorphous molybdenum carbide.

14. The pellicle of claim 12, wherein the molybdenum carbide containing layer contains $Mo_2C$.

15. The pellicle of claim 12, wherein the pellicle layer further includes:
a capping layer formed over one surface or both surfaces of the core layer.

16. The pellicle of claim 15, wherein the capping layer contains molybdenum carbide.

17. The pellicle of claim 12, wherein the pellicle layer further includes:
a buffer layer formed over the core layer; and
a capping layer formed over the buffer layer such that the buffer layer is disposed between the core layer and the capping layer,
wherein the buffer layer or the capping layer contains molybdenum carbide.

* * * * *